(12) United States Patent
Sturcken et al.

(10) Patent No.: US 10,658,331 B2
(45) Date of Patent: May 19, 2020

(54) PROCESSOR MODULE WITH INTEGRATED PACKAGED POWER CONVERTER

(71) Applicant: Ferric Inc., New York, NY (US)

(72) Inventors: Noah Sturcken, New York, NY (US); Ehsan Kalami, Novi, MI (US); Joseph Meyer, Plainsboro, NJ (US); Michael Lekas, New York, NY (US)

(73) Assignee: Ferric Inc., New York, NY (US)

( * ) Notice: Subject to any disclaimer, the term of this patent is extended or adjusted under 35 U.S.C. 154(b) by 0 days.

(21) Appl. No.: 16/129,305

(22) Filed: Sep. 12, 2018

(65) Prior Publication Data
US 2020/0075541 A1    Mar. 5, 2020

Related U.S. Application Data

(63) Continuation-in-part of application No. 16/114,448, filed on Aug. 28, 2018.

(51) Int. Cl.
*H01L 25/065* (2006.01)
*H02M 3/158* (2006.01)
(Continued)

(52) U.S. Cl.
CPC .......... *H01L 25/065* (2013.01); *H01L 23/481* (2013.01); *H01L 23/645* (2013.01);
(Continued)

(58) Field of Classification Search
CPC ....... H02M 3/156; H02M 3/158; H01F 27/24; H01F 27/2804; H01F 27/2823;
(Continued)

(56) References Cited

U.S. PATENT DOCUMENTS 7,538,565 B1 * 5/2009 Beaman ............. G01R 1/07307
324/755.11
9,177,944 B2   11/2015 New
(Continued)

OTHER PUBLICATIONS

M. Deo, "Enabling Next-Generation Platforms Using Intel's 3D System-in-Package Technology", White Paper, Sep. 4, 2017, pp. 1-7, Intel Corporation.
(Continued)

*Primary Examiner* — Adolf D Berhane
*Assistant Examiner* — Kevin H Sprenger
(74) *Attorney, Agent, or Firm* — Intrinsic Law Corp.

(57) ABSTRACT

A power management module comprises one or more power converter chips that are mounted on a power management package substrate. First and second electrical contacts are disposed on opposing first and second sides of the power management package substrate. The power management module can be mounted on a processor module to supply power to one or more processor chips in the processor module. In one example, the processor chip(s) are mounted on a first side of a processor package substrate and the power management module is mounted on an opposing second side of the processor package substrate. The power management module and the processor module can be centered and aligned with respect to each other or they can be offset laterally from each other. In another embodiment, the processor chip(s) are embedded in the processor package substrate.

20 Claims, 17 Drawing Sheets

(51) Int. Cl.
*H01L 49/02* (2006.01)
*H01L 23/48* (2006.01)
*H01L 23/64* (2006.01)

(52) U.S. Cl.
CPC .......... *H01L 28/10* (2013.01); *H02M 3/158* (2013.01); *H01L 2225/0652* (2013.01)

(58) Field of Classification Search
CPC ... H05K 1/0298; H01L 25/065; H01L 23/481; H01L 23/645; H01L 28/10; H01L 2225/0652
See application file for complete search history.

(56) References Cited

U.S. PATENT DOCUMENTS

| 2008/0164605 | A1* | 7/2008 | Wu | H01L 21/563 257/723 |
| 2011/0234196 | A1* | 9/2011 | Chiba | H01L 23/50 323/311 |
| 2011/0304994 | A1* | 12/2011 | Mair | H01L 23/5226 361/748 |
| 2014/0246773 | A1 | 9/2014 | Kent | |
| 2014/0264935 | A1* | 9/2014 | Kurashina | H01L 24/81 257/774 |
| 2015/0043171 | A1* | 2/2015 | Mugiya | H01L 23/552 361/728 |
| 2015/0255411 | A1 | 9/2015 | Karhade et al. | |
| 2016/0113115 | A1 | 4/2016 | Kwon et al. | |
| 2017/0236809 | A1 | 8/2017 | Trimberger et al. | |
| 2018/0130762 | A1* | 5/2018 | Tuominen | H01L 23/5384 |
| 2020/0006305 | A1* | 1/2020 | Lambert | H01L 25/0657 |

OTHER PUBLICATIONS

N. A. Sturcken, "Integrated Voltage Regulators with Thin-Film Magnetic Power Inductors", 2013, Columbia University.

ISA, "International Search Report", PCT/US2018/048290, dated Nov. 21, 2018.

* cited by examiner

//]:#

PROCESSOR MODULE WITH INTEGRATED PACKAGED POWER CONVERTER

CROSS-REFERENCE TO RELATED APPLICATIONS

This application is a continuation-in-part of U.S. application Ser. No. 16/114,448, titled "Processor Module with Integrated Packaged Power Converter," filed on Aug. 28, 2018, which is hereby incorporated by reference.

TECHNICAL FIELD

This application relates generally to power converters for integrated circuits.

BACKGROUND

Switched inductor DC-DC power converters such as buck converters provide conversion of power from a high voltage potential to a low voltage potential. These types of converters are used in a broad and diverse set of applications. One typical application is the conversion and regulation of power supplies for microprocessors and other sensitive or high-performance integrated circuits.

In current microelectronic systems, the components of the power converter (e.g., power control integrated circuit, power switches, inductor(s), and capacitors) are mounted on a circuit board at a significant lateral and vertical distance from the processor, which consumes the power output from the power converter. This large distance results in significant power loss due to thermal conduction loss ($P=I^2R$ loss) in the interconnect that transfers electrical current to the processor chip from the power converter on the circuit board. Additional power loss is caused by the large AC impedance that typically exists in the interconnect from circuit board to the processor chip or die because dynamic changes in processor current consumption will cause significant supply voltage deviations, which necessitate inefficient supply voltage margins to ensure that the supply does not fall below a minimum required voltage potential for correct operation of the processor chip. For example, "if the minimum supply voltage for correct operation of a processor is 0.7 V, but a "worst-case" load-current transient can induce a transient error on the supply voltage of 100 mV across the impedance of the power delivery interconnect, then it is necessary to supply the processor chip with >0.8 V to ensure that, in the event of a "worst-case" load-current transient, the supply voltage does not fall below 0.7 V. This supply voltage margin results in greater than 15% additional power consumption for the processor chip. An example of such a known system is illustrated in FIG. 1.

Some attempts have been made to integrate the power converter onto the processor package substrate. In doing so, the resistance and AC impedance of the electrical interconnect between the power supply regulator and processor chip is reduced, allowing for reductions in thermal conduction loss and supply voltage margin loss. However, such attempts have been unable to realize efficient power converter implementations that are small enough to be integrated in the processor package, and often incur additional performance or functionality compromises for the system, such as the removal of electrical terminals from the processor package substrate, which reduces data bandwidth to/from the processor.

It would be desirable to overcome one or more of these and other deficiencies in the art.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to an assembly comprising: a processor module comprising: a processor package substrate having opposing first and second sides; a processor chip mounted on the first side of the processor package substrate; and an array of electrical terminations disposed on the second side of the processor package substrate; and a power converter chip embedded in the processor package substrate.

In one or more embodiments, the processor package substrate comprises an organic polymer and conductive interconnects, the first conductive interconnects extending across opposing first and second sides of the processor package substrate. In one or more embodiments, a height of the power converter chip is about 50 µm to about 150 µm, the height measured with respect to an axis that is orthogonal to a plane defined by the first side of the processor package substrate. In one or more embodiments, the power converter chip is configured to fit within a core layer of the processor package substrate.

In one or more embodiments, the assembly further comprises electrical terminations disposed on opposing first and second sides of the power converter chip. In one or more embodiments, the power converter chip comprises silicon, gallium arsenide, or gallium nitride. In one or more embodiments, the power converter chip comprises: a multilevel wiring network; and an inductor integrated on top of the multilevel wiring network. In one or more embodiments, the inductor comprises a conductive winding, the conductive winding comprising: a first wire formed in a first integration plane disposed above the multilevel wiring network; a second wire formed in a second integration plane disposed above the first integration plane; and a conductive VIA formed between the first and second wires, the conductive VIA electrically connecting the first wire to the second wire. In one or more embodiments, the inductor comprises a planar magnetic core having alternating ferromagnetic and insulating layers. In one or more embodiments, the power converter chip comprises through-silicon VIAs that conduct electrical current through electrical terminations disposed on opposing first and second sides of the power converter chip. In one or more embodiments, the assembly further comprises a plurality of inductors integrated on top of the multilevel wiring network, the inductors configured to operate in a phase-interleaved manner to regulate an output supply voltage of the power converter chip.

In one or more embodiments, the assembly further comprises a plurality of the power converter chips, each power converter chip embedded in the processor package substrate. In one or more embodiments, a first power converter chip outputs a first supply current at a first supply voltage and a second power converter chip outputs a second supply current at a second supply voltage. In one or more embodiments, the first supply voltage is different than the second supply voltage. In one or more embodiments, the power converter chip includes one or more capacitors, one or more inductors, one or more transformers, or a combination of any of the foregoing. In one or more embodiments, the processor module and the power converter chip are aligned and centered with respect to each other to reduce a distance for electrical current to travel therebetween.

In one or more embodiments, the power converter chip is embedded between a core layer and the first side of the processor package substrate. In one or more embodiments, the power converter chip is disposed below an outer layer of the processor package substrate, wherein an exposed side of the outer layer forms the first side of the processor package substrate.

BRIEF DESCRIPTION OF THE DRAWINGS

For a fuller understanding of the nature and advantages of the present concepts, reference is made to the following detailed description of preferred embodiments and in connection with the accompanying drawings, in which.

DETAILED DESCRIPTION

A power management module comprises one or more power converter chips that are mounted on a power management package substrate. The power management module includes electrical contacts on opposing first and second sides. First electrical contacts (e.g., conductive studs) extend to the first side of the power management module. Each power converter chip is disposed between neighboring electrical contacts. Second electrical contacts (e.g., a ball grid array, a land grid array, or a pin grid array) are disposed on the second side of the power converter module (e.g., on the opposing side of the power management package substrate as the power convert chip(s)).

The power management module can be mounted on a processor module to supply power to one or more processor chips in the processor module. In one example, the processor chip(s) are mounted on a first side of a processor package substrate and power management module is mounted on an opposing second side of the processor package substrate. The first electrical contacts in the power management module can electrically connect the power converter chip(s) to a conductive interconnect in the processor package substrate, which is electrically coupled to the processor chip(s). The power management module and the processor module can be centered and aligned with respect to each other or they can be offset laterally from each other. In another embodiment, the power management module and the processor chip(s) are mounted on the same side of the processor package substrate. In another embodiment, one or more power converter chips is/are embedded in the processor package substrate.

Figure 2A:
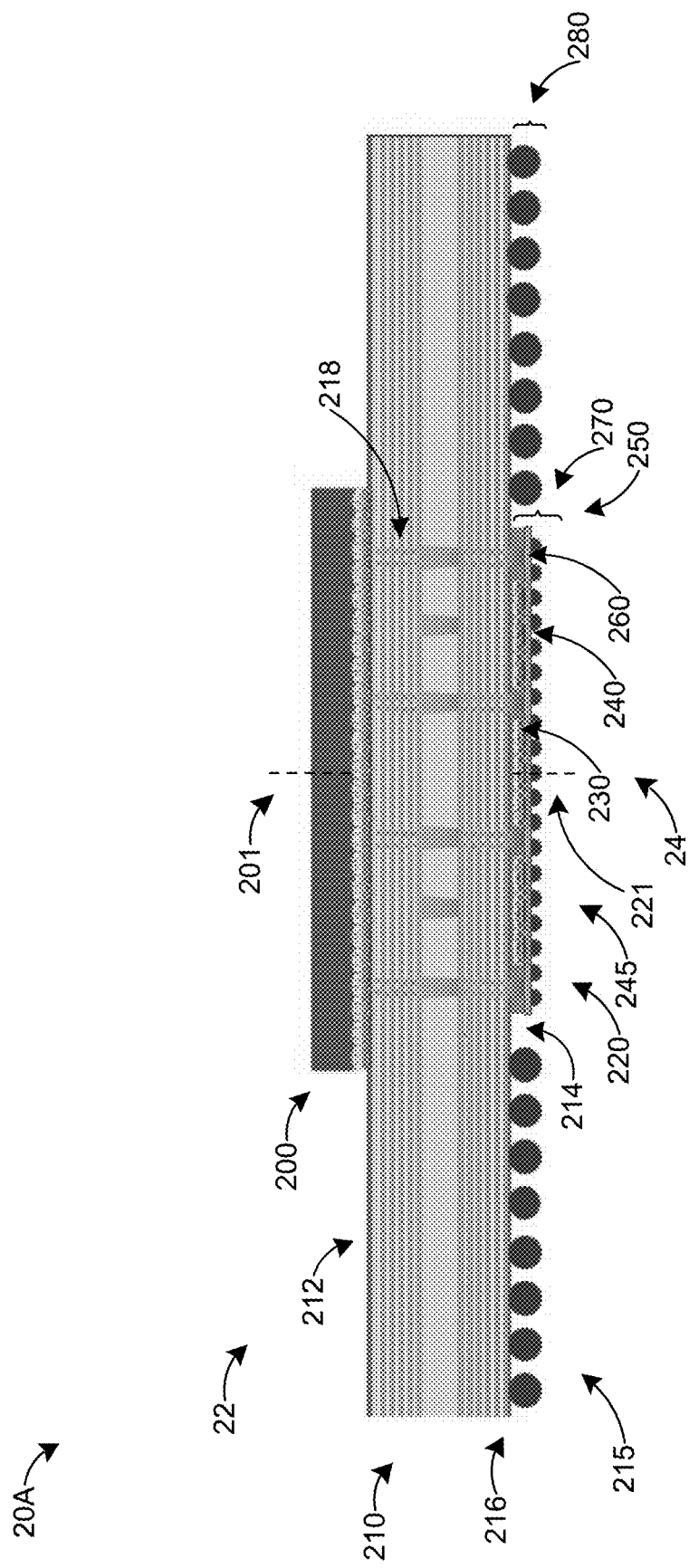
FIGS. 2A, 2B, and 2C are cross sections of an assembly according to one or more respective embodiments.

FIG. 2A is a cross-section of an assembly 20A according to one or more embodiments. The assembly 20A includes a system-on-a-chip (SoC) or processor (in general, a processor) 200, a processor package substrate 210, a power management package substrate 220, and one or more power converter chips 230. The processor 200 is mounted on a first side 212 of the processor package substrate 210, for example through wire bonding, flip-chip attachment, or other method as known in the art. The processor 200 and the processor package substrate 210 form a processor module 22. The processor 200 can include a processor chip (e.g., a central processing unit or a graphics processing unit), one or more memory chips (e.g., dynamic random access memory or DRAM, high-bandwidth memory, etc.), input/output ports, etc. The substrate or die for the processor 200 chip can comprise silicon, such as silicon-on-insulator (SOI), doped silicon (e.g., for complementary metal-oxide-semiconductor (CMOS)), or other form of silicon, or an insulator such as crystalline silicon dioxide.

The power management package substrate 220 is mounted on a second side 214 of the processor package substrate 210. As illustrated, the processor module 22 and the power management module 24 are centered and aligned with respect to each other. For example, the power management package substrate 220 and the processor 200 are centered and aligned with respect to each other such that the center points 221, 201 of the power management package substrate 220 and the processor 200, respectively, are aligned. Alignment of the power management module 24 and processor 200 chip is desirable to reduce the total distance between the processor 200 chip and power management module 24, and consequently, the broadband electrical impedance of the interconnect that transfers power to the processor 200 from the power management module 24. In common commercial implementations of organic package substrates for processor chip, the package substrate is typically less than 1 mm thick while the width may be greater than 50 mm. Therefore, the effective distance and electrical impedance between processor chip and power module can be lower when the power management module 24 is mounted on the second side 214 of the processor package substrate 210, rather than being mounted on the first side 212 of the processor package substrate 210. However, in other embodiments, the power management package substrate 220 and the processor 200 can be horizontally offset from each other, for example along an axis that lies in a plane defined by the first or second sides 212, 214 of the processor package substrate 210.

The power management package substrate 220 includes one or more power converter chips 230 that are mounted on a first side of the power management package substrate 240 to form a power management module 24. In addition, the power management package substrate 220 can include one or more discrete passive electrical components as described herein.

An array of processor package electrical terminals 215 is disposed on the second side of the processor package substrate 210. The processor package electrical terminals 215 provide data signal input/output connections to the processor 200 via a processor package interconnect that includes conductive layers 216 and conductive columns 218 formed the processor package substrate 210. The conductive layers 216 and conductive columns 218 can comprise copper, gold, aluminum, and/or another conductive material. The processor package electrical terminals 215 can include a ball grid array (BGA) (e.g., as illustrated in FIG. 2A), a land grid array (LGA), and/or a pin grid array (PGA), or other custom socket connections.

The power management module 24 is disposed in a gap 250 in the array of processor package electrical terminals 215. An array of power management package electrical terminals 245 is disposed on a second side of the power management package substrate 240. At least some power management package electrical terminals 245 provide power input connections (e.g., to conduct current) to the power converter chips 230 and, optionally, at least some power management package electrical terminals 245 can provide data signal input/output connections to the processor 200. In some embodiments, a majority (e.g., greater than 50%) of the power management package electrical terminals 245 provide power input and ground connections to the power converter chips 230.

The power management package electrical terminals 245 and the processor package electrical terminals 215 can include the same type of electrical terminals. For example, both the power management package electrical terminals 245 and the processor package electrical terminals 215 can include a BGA, an LGA, and/or a PGA. In some embodiments, one or both of the power management package electrical terminals 245 and the processor package electrical terminals 215 are configured or designed to mate with an electrical socket. An example of electrical terminals that are configured or designed to mate with an electrical socket include an LGA and/or a PGA.

Figure 3:
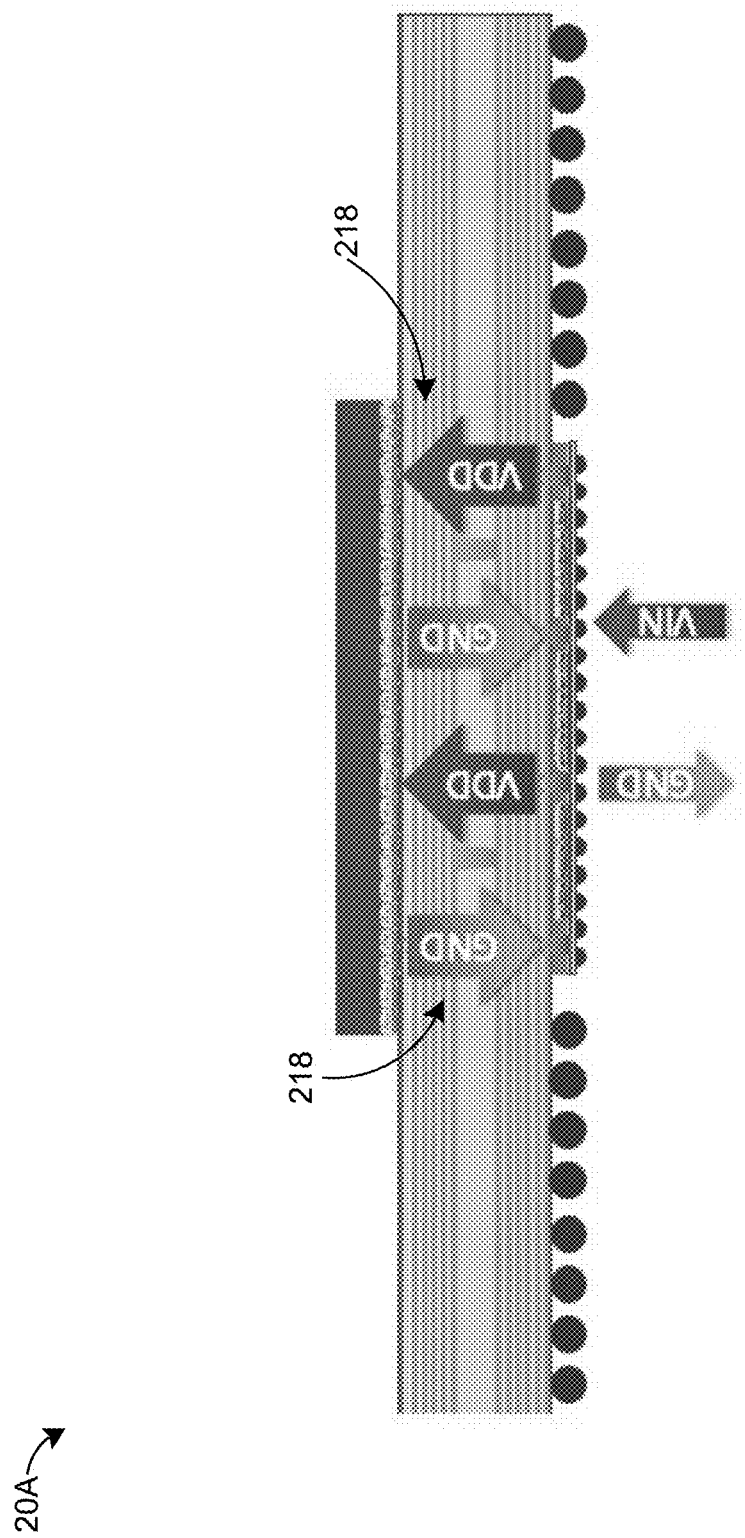
FIG. 3 includes representations of the electrical relationships among certain components in the cross section illustrated in FIG. 2A.

An array of conductive studs or columns (in general, conductive studs) 260 are disposed in the power management package substrate 220. Each power converter chip 230 is disposed between neighboring conductive studs 260. The conductive studs 260 are in electrical communication with the power converter chips 230 and the conductive layers 216 and/or conductive columns 218 to provide an electrical conduction path to transmit the output power from power converter chips 230 to the processor 200. One or more of the conductive studs 260 conduct a supply power (e.g., a supply current at a supply voltage $V_{DD}$) and one or more of the conductive studs 260 is/are grounded and conduct a ground current from the processor 200, for example as illustrated in FIG. 3. For example, a first conductive stud 260 conducts a supply power (e.g., a supply current at a supply voltage $V_{DD}$) to a first interconnect (e.g., a first conductive column 218) in the power management package substrate 220 and a second conductive stud 260 conducts a ground current from a second interconnect (e.g., a second conductive column 218) in the power management package substrate 220. The first and second conductive columns 218 are in electrical communication with the processor 200. In some embodiments, the conductive studs 260 are also used to transmit electrical signals between the processor 200 and the power module 24. Thus, the power management module 24 has electrical terminations on two sides: the conductive studs 260 on the first or top side and the power management package electrical terminals 245 on the second or bottom side.

When the power management package substrate 220 and the processor 200 are centered and aligned with respect to each other, as illustrated in FIG. 2A, the output power flowing through the conductive studs 260 travels vertically through the conductive columns 218 to the processor 200. However, when the power management package substrate 220 and the processor 200 are horizontally offset with respect to each other, the output power flowing through the conductive studs 260 travels horizontally through the conductive layers 216 and vertically through the conductive columns 218 to the processor 200. Though both configurations are contemplated, it is recognized that aligning and centering the power management package substrate 220 and the processor 200 reduces the distance that the output power/current has to travel, which reduces loss and electrical resistance through the processor package interconnect (e.g., conductive layers 216 and conductive columns 218) between the power management module 24 and the processor 200. For example, the reduced distance that the output power/current has to travel can decrease the broadband electrical impedance of the interconnect that transfers power to the processor 200 from the power management module 24.

In some embodiments, the power management module 24, including the power management package substrate 220, power converter chips 230, and the power management package electrical terminals 245, has a cross-sectional height 270 that is less than or equal to the cross-sectional height 280 of the processor package electrical terminals 215 such that the power management module 24 can fit alongside the processor package electrical terminals 215 without extending vertically (as illustrated in FIG. 2A) beyond the processor package electrical terminals 215. In some embodiments, the processor package electrical terminals 215 have a cross-sectional height 280 of about 1 mm, about 0.8 mm, about 0.6 mm, any cross-sectional height or range between any two of the foregoing cross-sectional heights, or a smaller cross-sectional height. As used herein, "about" means plus or minus 10% of the relevant value.

The cross-sectional height 270 of the power management module 24 is less than or equal to the corresponding cross-sectional height 280 of the processor package electrical terminals 215, for example less than or equal to about 1 mm, less than or equal to about 0.8 mm, less than or equal to about 0.6 mm, or other cross-sectional height 280 of the processor package electrical terminals 215. In a specific embodiment, the cross-sectional height 270 of the power management module 24 is less than or equal to the corresponding cross-sectional height 280 of the processor package electrical terminals 215 when the processor package electrical terminals 215 include a BGA and/or a PGA. In other embodiments, the cross-sectional height 270 of the power management module 24 can be greater than or equal to the cross-sectional height 280 of the processor package electrical terminals 215, for example when the processor package electrical terminals 215 include an LGA.

The processor package substrate 210 and/or the power management package substrate 220 can include an organic polymer material, resin, epoxy, thermoplastic, prepreg, and/or another material. In some embodiments, the power management package substrate 220 and the power management chip(s) comprise a wafer-level package, such as a chip-scale package or a fan-out package. A wafer-level package can reduce the cross-sectional height 270 or profile of the power management module 24, which can allow the power management module 24 to fit within a smaller cross-sectional height 280 of processor package electrical terminals 215, such as a BGA. For example, the cross-sectional height 270 of the power management module 24 can be about 0.5 mm or less using a fan-out wafer-level package. Note that in the case of a wafer-level package, the power management package substrate is fabricated on the power converter chips and a polymer filler material.

In operation, as illustrated in FIG. 3, a current having an input voltage $V_{IN}$ is transmitted to the power management package electrical terminals 245, which electrically conduct the current to the power converter chips 230. The power converter chips 230 down convert the input voltage $V_{IN}$ to the supply voltage $V_{DD}$. The current at the supply voltage $V_{DD}$ is then transmitted to the processor 200 via the conductive studs 260 and conductive columns 218 (and optionally the conductive layers 216). In one example, the input voltage $V_{IN}$ is about 2 V and the supply voltage $V_{DD}$ is about 0.8 V. In some embodiments, the input voltage $V_{IN}$ is about 5 V, about 12 V, about 48 V, or another input voltage. In some embodiments, the supply voltage $V_{DD}$ is about 1.8 V, 1.2 V, 1.2 V-0.4 V, or another output voltage. In some embodiments, one or more of the power converter chips 230 down converts the input voltage $V_{IN}$ to a first supply voltage $V_{DD1}$ and one or more of the power converter chips 230 down converts the input voltage $V_{IN}$ to a second supply voltage $V_{DD2}$ that is different than the first supply voltage $V_{DD1}$. For example, the first supply voltage $V_{DD1}$ can be used to power a first chip (e.g., that requires a first current (e.g., 200 A)) in the processor module 22 and the second supply voltage $V_{DD2}$ can be used to power a second chip (e.g., that requires a second current (e.g., 20 A)) in the processor module 22. The substrate or die for the power convert chips 230 can comprise silicon, such as a SOI, doped silicon (e.g., for CMOS), or other form of silicon, gallium nitride (GaN), and/or gallium arsenic (GaAs).

Figure 2B:
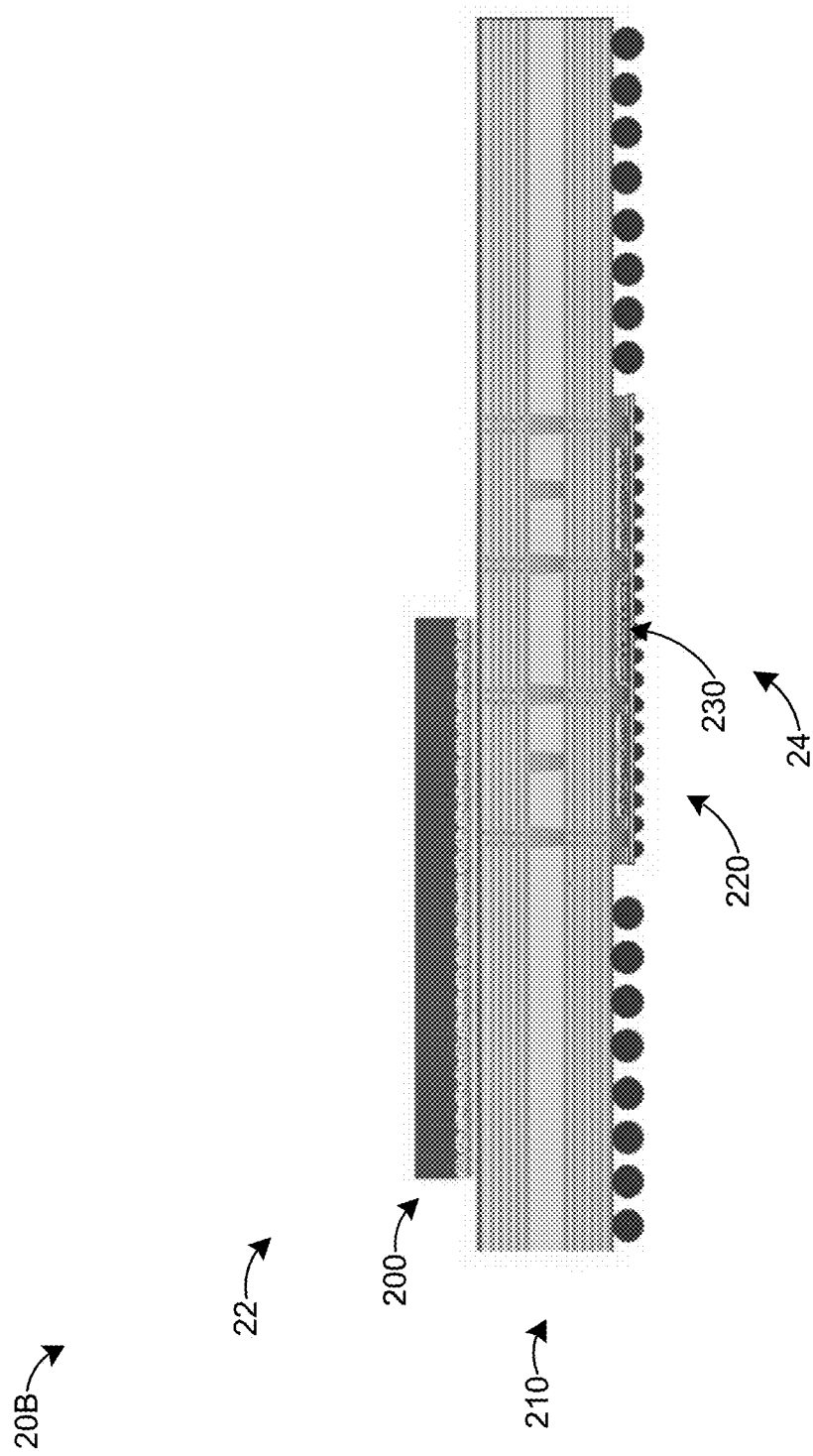

FIG. 2B is a cross section of an assembly 20B according to another embodiment. Assembly 20B is the same as assembly 20A except that the processor chip 200 and the power management module 24 are laterally offset.

Figure 2C:
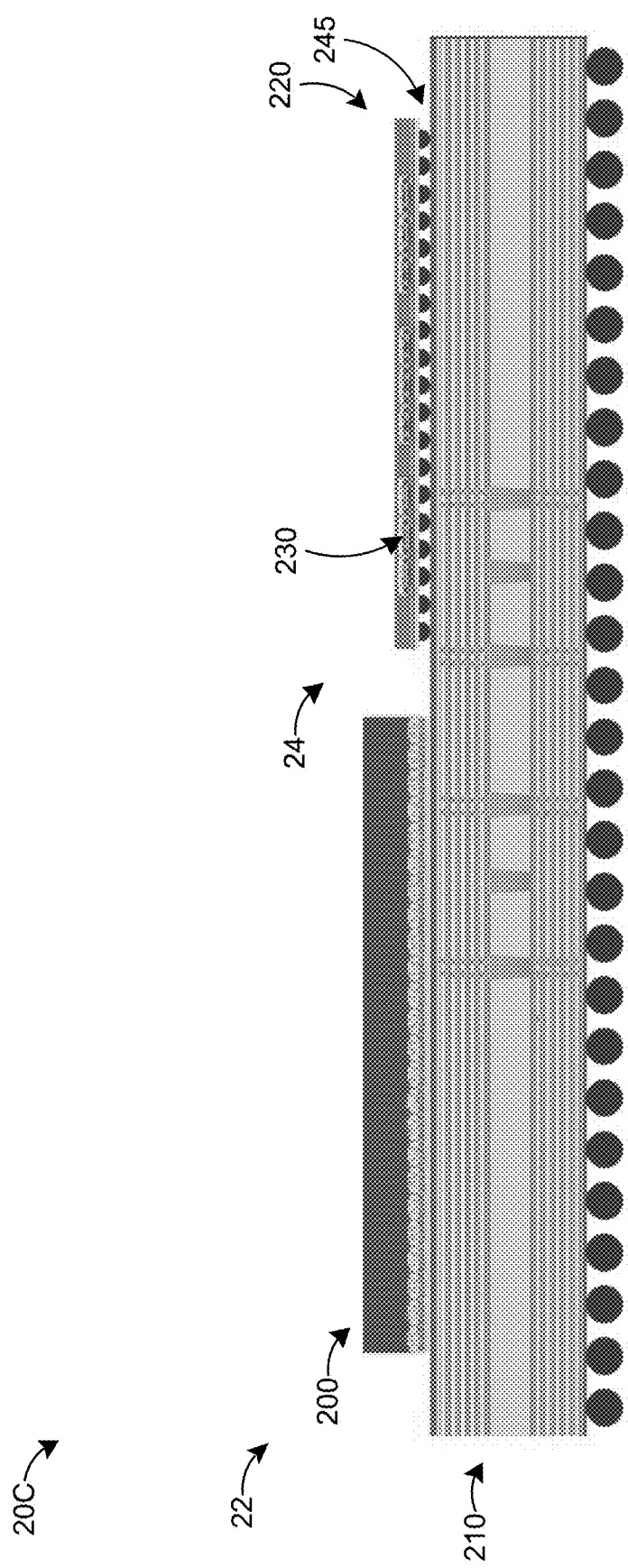

FIG. 2C is a cross section of an assembly 20C according to another embodiment. Assembly 20C is the same as assembly 20A except that the processor chip 200 and the power management module 24 are disposed on the same side of the processor package substrate 210. In addition, the power management package substrate 220 only includes electrical contacts (power management package electrical terminals 245) on one side. The power management substrate 220 does not include the conductive studs 260. In other embodiments, the power management package substrate 220 only includes conductive studs 260 on one side and does not include power management package electrical terminals 245.

Figure 4:
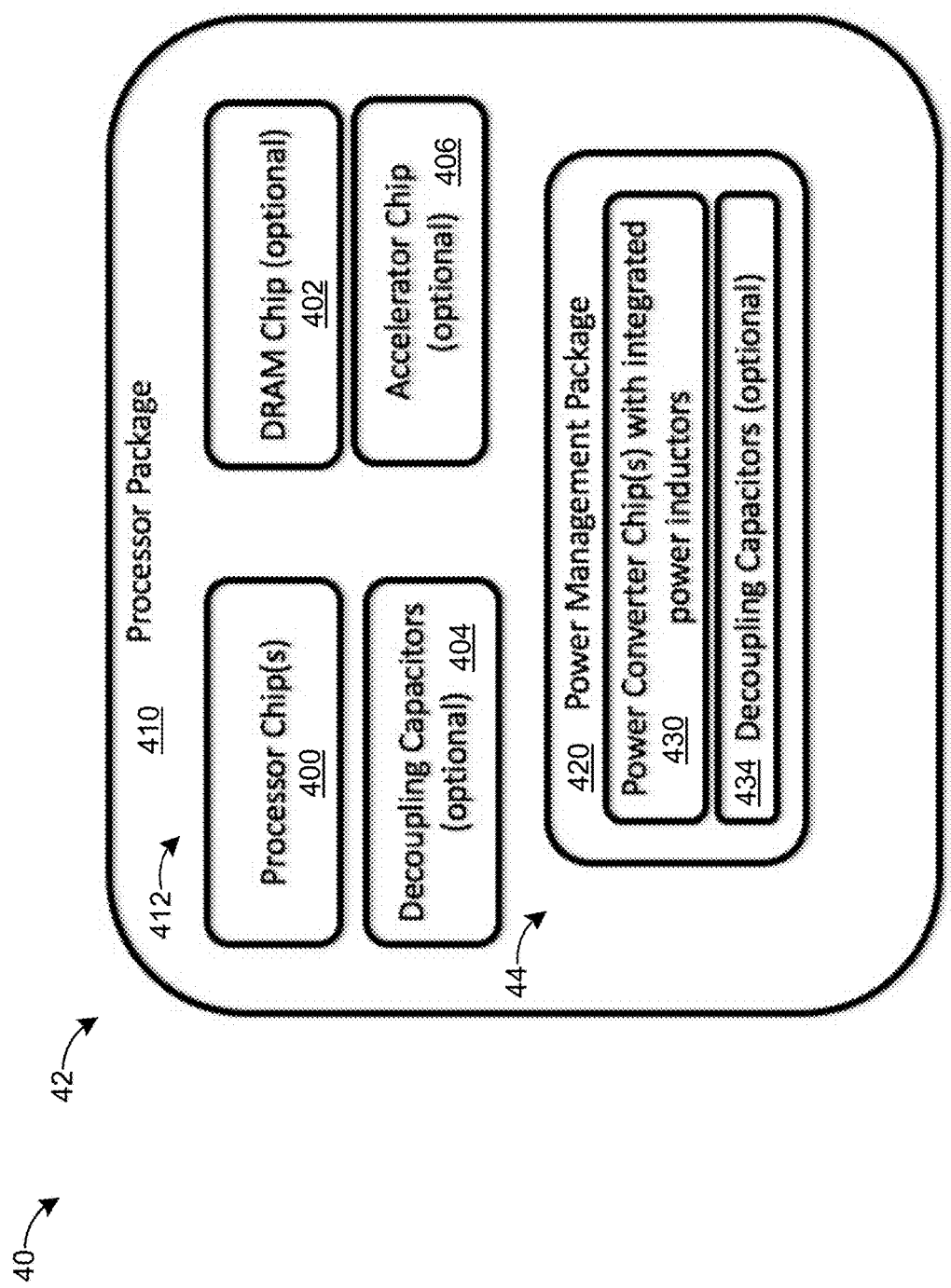
FIG. 4 is a block diagram of an assembly according to one or more embodiments.

FIG. 4 is a block diagram of an assembly 40 according to one or more embodiments. The assembly 40 includes a processor module 42 and a power management module 44. The processor module 42 includes one or more processor chips 400, optional memory chips 402, optional decoupling capacitors 404, an optional accelerometer chip 406, and a processor package substrate 410. In some embodiments, the processor chip(s) 400 and optionally the memory chip(s) 402 are the same as or different than the processor/SoC 200. The processor chip(s) 400, the optional memory chip(s) 402, the optional decoupling capacitors 404, and the optional accelerometer chip 406 are mounted on a first side 412 of the processor package substrate 410, such as by wire bonding, flip-chip attachment, or other method as known in the art.

The power management module 44 includes one or more power converter chips 430, optional decoupling capacitors 434, and a power management package substrate 420. The power converter chip(s) 430 and the optional decoupling capacitors 434 are mounted on the power management package substrate 420, such as by wire bonding, flip-chip attachment, or other method as known in the art. In some embodiments, the power converter chip(s) 430 include a thin-film power inductor, such as a magnetic core inductor or a magnetic clad inductor, that is integrated into a multi-level wiring network. For example, the power converter chip(s) 430 can be the same as or different than the power converter chips and chiplets disclosed in U.S. Patent Application Publication No. 2018/0110123, titled "Integrated Switched Inductor Power Converter," published on Apr. 19, 2018, which is incorporated herein by reference.

The power management module 44 can be mounted on a second side of the processor package substrate 410, for example as illustrated in FIGS. 2 and 3. Alternatively, the power management module 44, the processor chip(s) 400, the memory chip(s) 402, the optional decoupling capacitors 404, and the optional accelerometer chip 406 can be mounted on the same side (e.g., the first side) of the processor package substrate 410.

The processor module 42 and the power management module 44 can be the same or different than the processor module 22 and the power management module 24. Thus, the assembly 40 can be the same as or different than the assemblies 20A, 20B, and/or 20C.

The assembly 40 includes processor package electrical terminals (e.g., processor package electrical terminals 215) (not illustrated in FIG. 4) on the second side of the processor package substrate 410. The first and second sides are on opposing sides of the processor package substrate 410. The processor package electrical terminals can include a BGA, an LGA, a PGA, and/or other custom socket connections.

Figure 5:
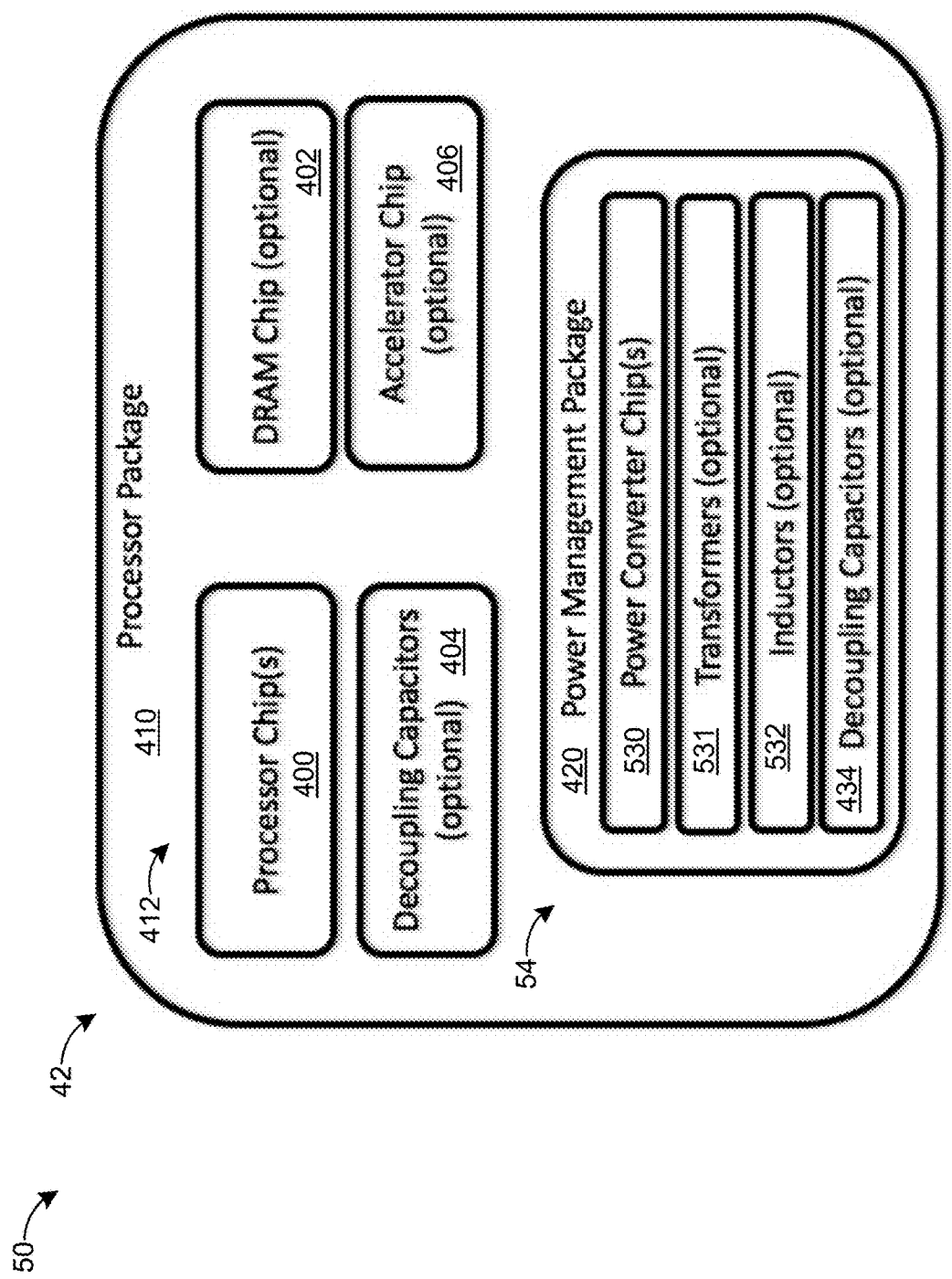
FIG. 5 is a block diagram of an assembly according to one or more embodiments.

FIG. 5 is a block diagram of an assembly 50 according to one or more embodiments. The assembly 50 includes processor module 42 and a power management module 54. Power management module 54 includes one or more power converter chips 530, one or more optional transformers 531, one or more optional inductors 532, and optional decoupling capacitors 434. In this embodiment, the power converter chip(s) 530 do not include an integrated thin-film power inductor, as described above with respect to power converter chip(s) 430. Instead, the power management module 54 includes inductor(s) 532 and/or transformer(s) 531 that are not disposed on the same chip(s) as the power converter chip(s) 530, respectively.

The assembly 50 includes processor package electrical terminals (e.g., processor package electrical terminals 215) (not illustrated in FIG. 5) on the second side of the processor package substrate 410. The first and second sides are on opposing sides of the processor package substrate 410. The processor package electrical terminals can include a BGA, an LGA, a PGA, and/or other custom socket connections.

Figure 6:
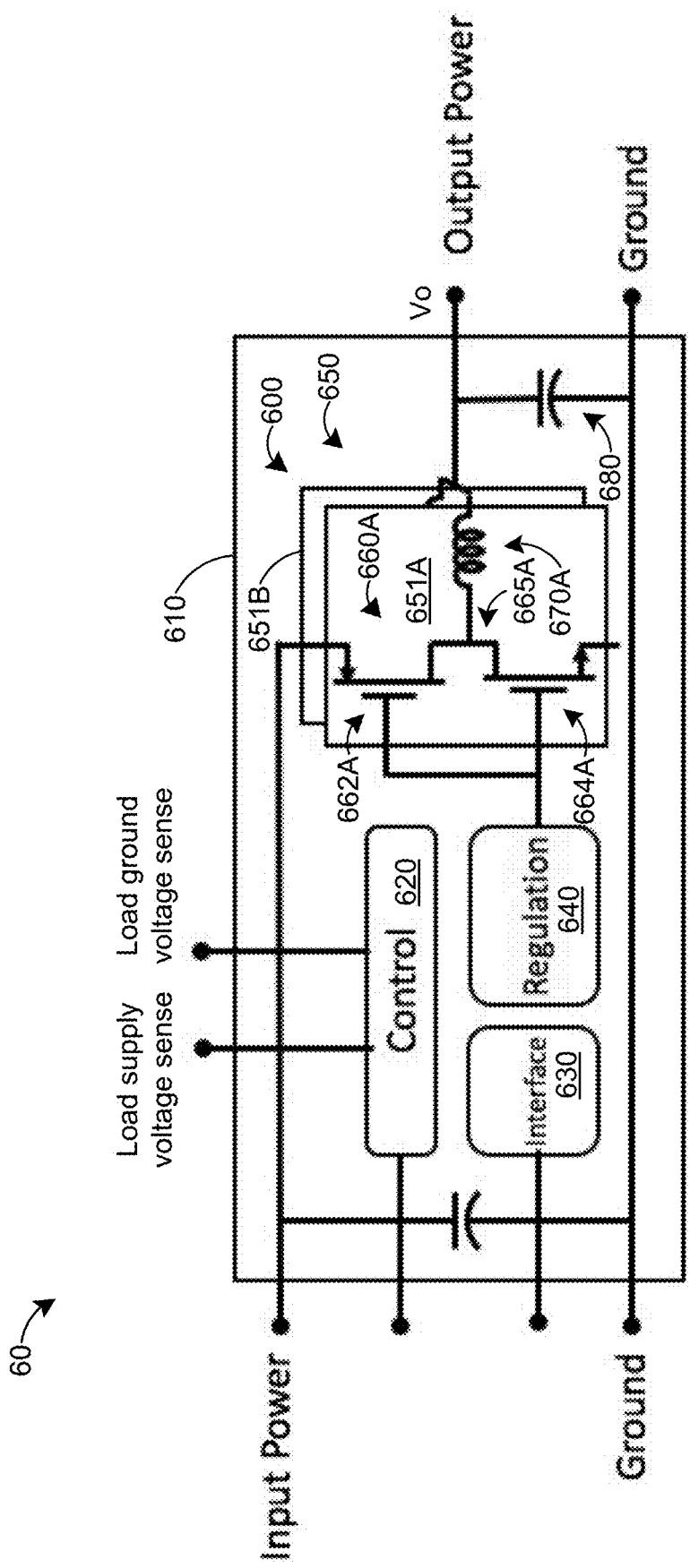
FIG. 6 is a schematic representation of a switched inductor DC-DC power converter chiplet according to one or more embodiments.

FIG. 6 is a schematic representation of a switched inductor DC-DC power converter chiplet 60 according to one or more embodiments. The switched inductor DC-DC power converter chiplet 60 can be included in the power converter chip(s) 230 and/or 430, which in some embodiments includes a plurality of such chiplets 60. The switched inductor DC-DC power converter chiplet 60 includes a switched inductor DC-DC power converter 600 that is fabricated and/or integrated on a common power converter substrate 610, such as a silicon substrate. The switched inductor DC-DC power converter 600 includes feedback control circuitry 620, interface circuitry 630, regulation circuitry 640, and a power train 650.

The power train 650 is divided into phases 651A, 551B (in general, phase 651N). Each phase 651N includes a separate power switch 660N and a separate thin-film inductor 670N. Each power switch 660N can be a CMOS power switch comprising PMOS and NMOS transistor gates 662N, 664N, respectively. Each transistor gate 662N, 664N can include two switches in series in a cascode configuration. In some embodiments, both the high-side and low-side switches are comprised of NMOS transistors (e.g., transistor gates 664N).

For example, phase 600A includes power switch 660A and thin-film inductor 670A. Power switch 660A includes PMOS and NMOS transistor gates 162A, 164A, respectively. Phase 651B is identical to phase 651A and thus includes its own power switch 660B and thin-film inductor 670B (not illustrated in FIG. 6). Switched inductor DC-DC power converter chiplet 60 can include additional phases 600N as desired. Each phase 600N is electrically in parallel with the other phases 600N. A common output terminal electrically couples the output of each phase 500N to the output power line. A common input terminal electrically couples the input of each phase 500N to the input power line to receive an input current at an input voltage ($V_{IN}$).

Feedback control circuitry 620 is configured to open and close PMOS and NMOS transistor gates 662N, 664N. When a PMOS transistor gate 662N is open, the corresponding NMOS transistor gate 664N is closed and vice versa. Opening and closing each set of PMOS and NMOS transistor gates 662N, 664N generates a corresponding pulse width modulation (PWM) signal at the output of half-bridge node 665N. The frequency of the PWM signal can be configured in feedback control circuitry as known in the art. Feedback control circuitry 620 adjusts the duty cycle of the PWM signal to raise or lower the output voltage Vo so that the output voltage Vo equals a target output voltage, such as $V_{DD}$. Feedback control circuitry 620 monitors the output voltage Vo through load supply voltage sense and load ground sense feedback lines, as illustrated in FIG. 6. The separate supply voltage sense and ground reference sense lines allow the power converter chiplet 60 to measure the output voltage at the load independent of the power delivery channel. In addition, control circuitry 620 can vary the number of phases 600N that are electrically connected to the load current to improve power conversion efficiency, or to rapidly supply more or less current as the processor requirement changes dynamically. For example, control circuit 620 can increase the number of phases 600N that are electrically connected to the load current in response to an increase in the load current.

Feedback control circuitry 620 calculates a voltage error, which is the difference between the output voltage Vo and the target output voltage. The target output voltage can be set manually or pre-programmed based on the specifications of the load (e.g., of the processor 200). If there is a positive voltage error (e.g., the output voltage Vo is greater than the target output voltage), feedback control circuitry 620 can respond by decreasing the duty cycle of the PWM signal generated by power switch 660. If there is a negative voltage error (e.g., the actual output voltage Vo is less than the target output voltage), feedback control circuitry 620 can respond by increasing the duty cycle of the PWM signal generated by power switch 660.

Interface circuitry 630 provides an interface connection or connections between one or more electrical contact points on the chiplet 60 or circuit and one or more electrical contact points off of the chiplet 60 or circuit.

Regulation circuitry 640 is configured to open and close the PMOS and NMOS transistor gates 662, 664 according to the PWM signal generated by control circuitry 620.

Thin-film inductor 670 and output capacitor 680 form a low pass filter. The thin-film inductor 670 is formed in the multilevel wiring network of the power converter substrate 610 as described herein. The thin-film inductor 670 can include a magnetic core inductor and/or a magnetic clad inductor.

Figure 7:
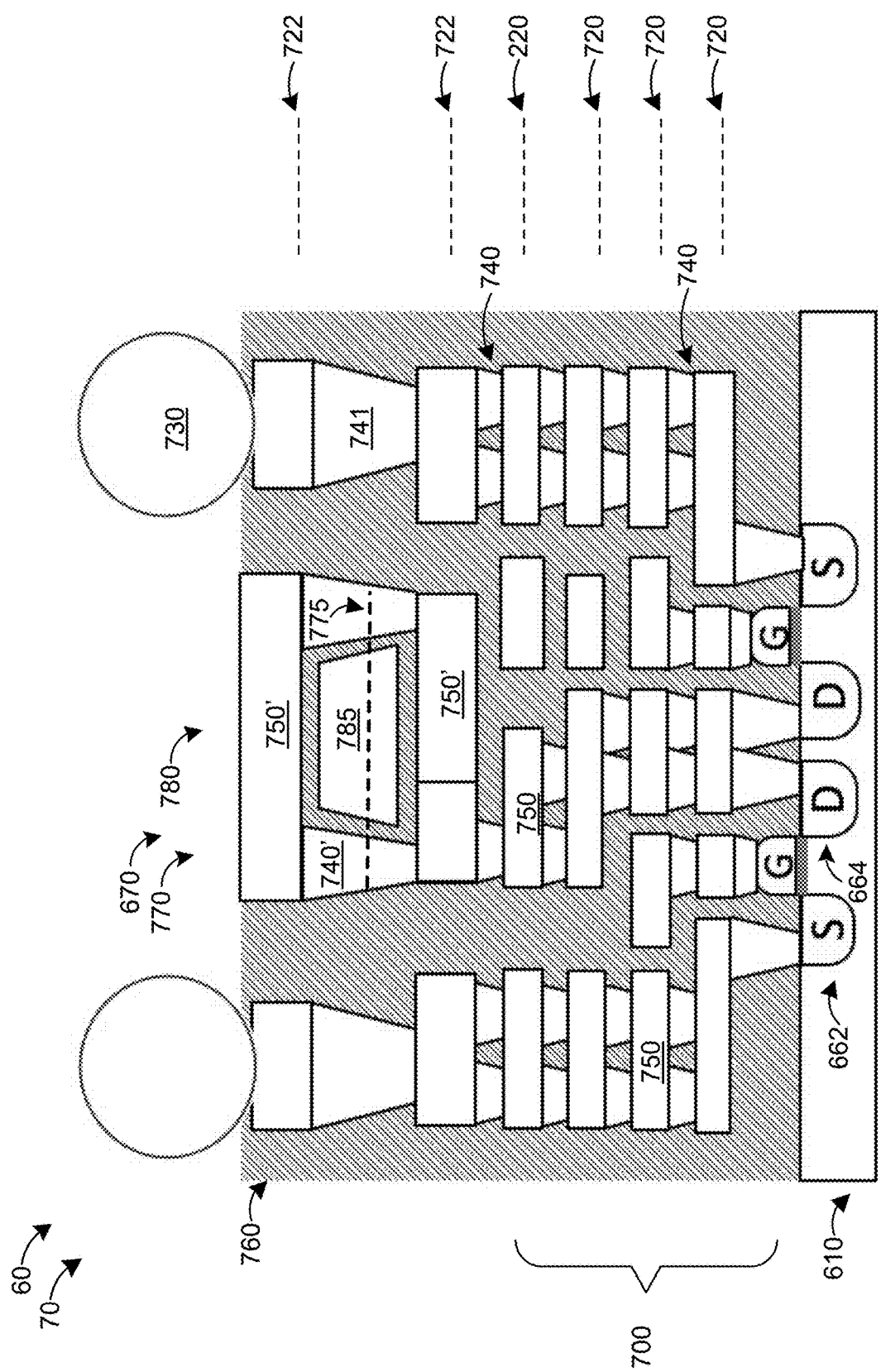
FIG. 7 is a representative cross section of the switched inductor DC-DC power converter chiplet illustrated in FIG. 6 according to a first embodiment.

FIG. 7 is a representative cross section 70 of the switched inductor DC-DC power converter chiplet 60 illustrated in FIG. 6 according to a first embodiment. In the embodiment illustrated in FIG. 7, the thin film-inductor 670 includes a magnetic core inductor 770 integrated on top of a multilevel wiring network 700.

The cross section 60 illustrates PMOS and NMOS transistor gates 662, 664 fabricated on power converter substrate 110. The multilevel wiring network 200 provides electrical connections between the PMOS and NMOS transistor gates 662, 664, the magnetic core inductor 770, and IC chip contact structures 730. The multilevel wiring network 700 is arranged into wiring planes 720. FIG. 7 depicts 4 wiring planes 720 but without limitation on any actual number of planes. Each wiring plane 720 contains wire segments 750. Electrical connections between wiring segments 750 of differing wiring planes 720 are provided by conductive VIAs 740. IC chip contact structures 730 can be C4 contacts, solder bumps, or copper pillars, but any other contacts for the chip's external communication are acceptable without limitation. The contacts 730 are electrically coupled to the conductive studs in the power management module (e.g., power management module 24) through an electrical interconnect in the power management package (e.g., power management package substrate 220). The spaces in the multilevel wiring network 700 are filled with a dielectric insulating material 760 such as $SiO_2$.

The magnetic core inductor 670 with a single planar magnetic core 785 is integrated on top of the multilevel wiring network 700. The principal plane 775 of the planar magnetic core 785 is substantially parallel with the wiring planes 720. The conductive winding 780 of the magnetic core inductor 770, forming a general spiral on the outside of the planar magnetic core 785, is piecewise constructed of wire segments 750' and of VIAs 740' that are disposed in at least two integration planes 722, which are formed on top of the multilevel wiring network 700. The VIAs 740' that form parts of the windings 780 are vertical to the principal plane 775 and electrically interconnect the wire segments 750' in at least two integration planes 722.

The magnetic core 785 can include a ferromagnetic material such as Co, Ni, and/or Fe, including an alloy thereof such as $Ni_xFe_y$ or $Co_xNi_yFe_z$. In addition, or in the alternative, magnetic core 785 can include a plurality of layers. The layers can include alternating layers of ferromagnetic layers (e.g., Co, Ni, and/or Fe, an alloy of Co, Ni, and/or Fe, etc.) and non-ferromagnetic layers. For example, the non-ferromagnetic layers can be or can include an insulating material, such as the oxides of the ferromagnetic material (e.g., $Co_xO_y$, $Ni_xO_y$, and/or $Fe_xO_y$).

In some embodiments, an interface layer can be deposited on the insulating material layer. The interface layer can be used in the fabrication process to help deposit the next ferromagnetic layer onto the insulating material layer. The material comprising interface layer can be selected to improve adhesion and/or reduce roughness at the interface between the ferromagnetic layer and the insulating material layer. Reducing the roughness at the interface of the ferromagnetic layer and the insulating material layer can reduce coercivity for the magnetic core 180. Improving the adhesion between the ferromagnetic layer and the insulating material layer can reduce the potential for film delamination. Additionally, the interface layer can serve as a diffusion barrier or getter between the ferromagnetic layer and the insulating material layer to prevent the diffusion of material constituents from the insulating material layer to the ferromagnetic layer. Finally, the interface layer can be chosen to reduce or compensate mechanical film stress in the magnetic core 785. The interface layer can be comprised of Ta, Ti, W, Cr, or Pt, or a combination of any of the foregoing, depending on the particular choice of ferromagnetic material and insulating material layer.

In some embodiments, the non-ferromagnetic layers can be or can include a current-rectifying layer. For example, the current-rectifying layers can be based on Schottky diodes. Onto the ferromagnetic layer one may electrodeposit the following sequence: a semiconducting layer—p-type with work function less than ferromagnetic layer or n-type with work function greater than ferromagnetic layer; followed by an interface metal layer—with a work function less than that of p-type semiconducting material, or greater than that of n-type semiconducting material. Then, continue with the next ferromagnetic layer, and so on. Alternatively, for rectification one may use a semiconductor p-n junction in the non-ferromagnetic layer. Any semiconductor may be suitable, one would have to choose one based on several criteria, for example without limiting, the ease of contact to the magnetic material of the p and n portions, how narrow can one make the junction, and others In some embodiments, the magnetic core inductor 270 is the same as, substantially the same as, or similar to one or more of the inductors described in U.S. patent application Ser. No. 15/391,278, U.S. Patent Application Publication No. 2014/0071636, and/or U.S. Pat. No. 9,647,053, which are hereby incorporated by reference. In some embodiments, the switched inductor DC-DC power converter chiplet 60 and cross section 70 include a plurality of inductors, each of which can be the same or similar to inductor 670. The plurality of inductors can be arranged in parallel electrically with one another, in series electrically with one another, or a combination thereof. The plurality of inductors can be integrated on the same integration planes 222 or in different integration planes.

Figure 1:
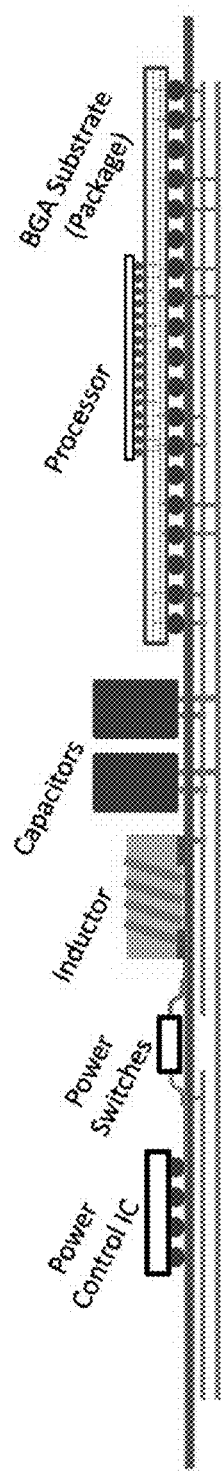
FIG. 1 is a schematic of an assembly according to the prior art.
Figure 8:
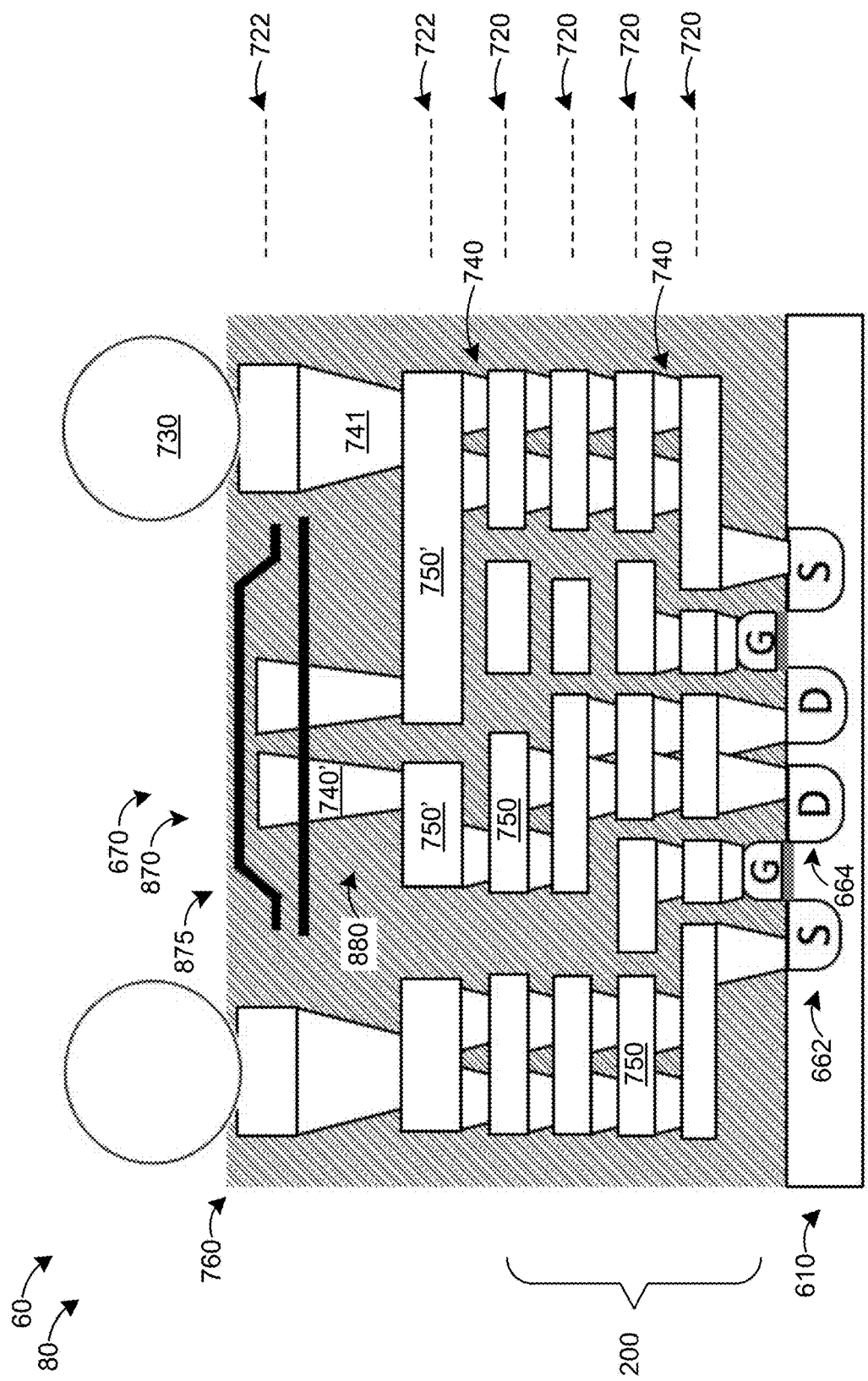
FIG. 8 is a representative cross section of the switched inductor DC-DC power converter chiplet illustrated in FIG. 6 according to a second embodiment.

FIG. 8 is a cross section 80 of the switched inductor DC-DC power converter chiplet 60 illustrated in FIG. 1 according to a second embodiment. Cross section 80 is the same or substantially the same as cross section 70 except as described below. In the embodiment illustrated in FIG. 8, the thin film-inductor 670 includes a magnetic clad inductor 870 integrated on top of multilevel wiring network 700. The magnetic clad inductor 870 includes a ferromagnetic yoke 875 that surrounds a conductive winding 880. The ferromagnetic yoke 375 can include Co, Ni, and/or Fe, such as $Ni_xFe_y$, or another material as known in the art. The conductive winding 880 forms a general spiral over which the yoke 875 is disposed.

The conductive winding 880 is piecewise constructed of wire segments 750' and of VIAs 740' in at least two integration planes 722. The VIAs 740' that form parts of the windings 880 are interconnecting the at least two integration planes 722. It is noted that the wire segments 750' in the top integration plane 722 are not illustrated in FIG. 8 since they would not be visible in cross section 80.

In some embodiments, the switched inductor DC-DC power converter chiplet 60 and cross-section 80 include a plurality of inductors, each of which can be the same or similar to inductor 870. The plurality of inductors can be arranged in parallel electrically with one another, in series electrically with one another, or a combination thereof. The plurality of inductors can be integrated on the same integration planes 722 or in different integration planes 722. In some embodiments, the switched inductor DC-DC power converter chiplet 60 includes one or more inductors 770 and one or more inductors 870.

Figure 9:
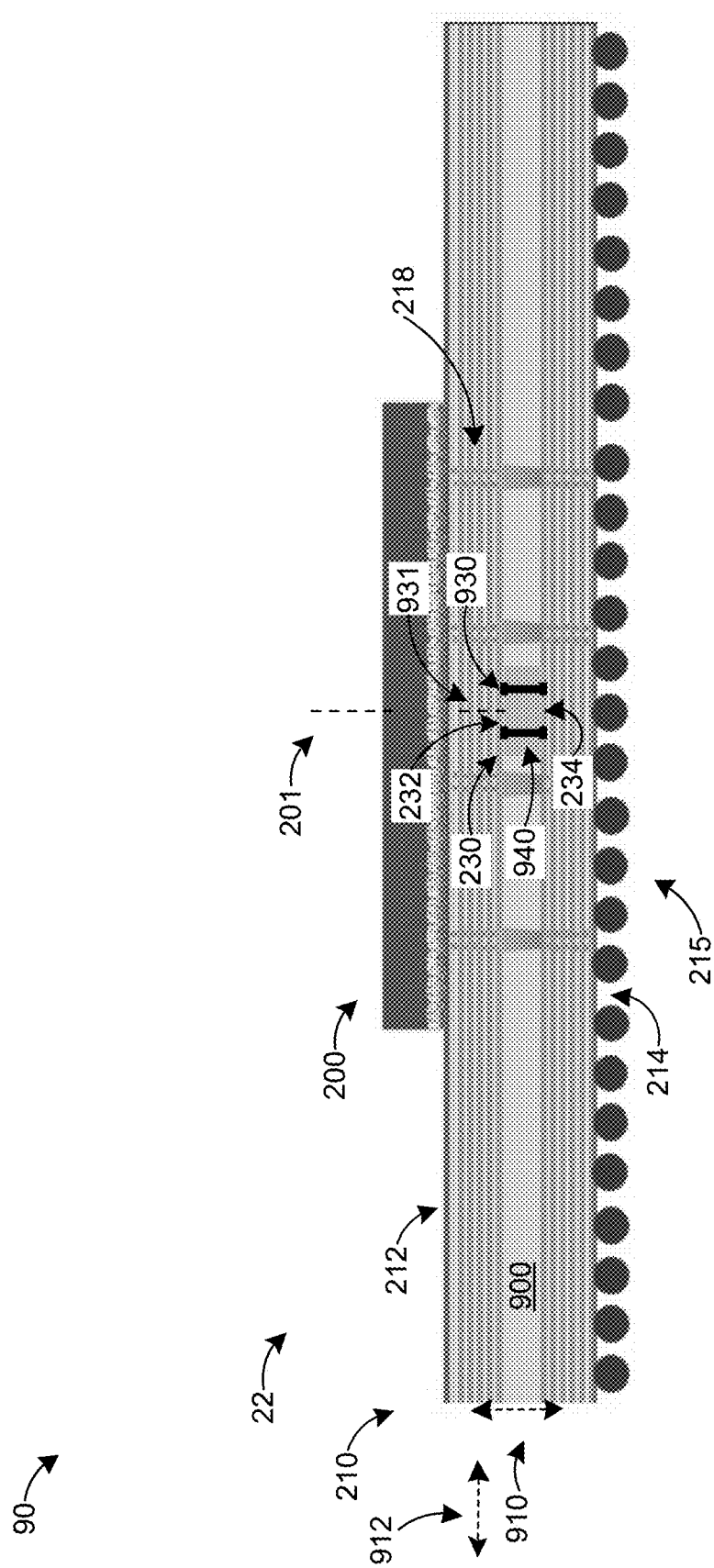
FIG. 9 is a cross-section of an assembly according to one or more embodiments.

FIG. 9 is a cross-section of an assembly 90 according to one or more embodiments. The assembly 90 includes a processor 200, a processor package substrate 210, and a power converter chip 230. The power converter chip 230 is embedded in (e.g., disposed in one or more layers of) the processor package substrate 210. For example, as illustrated in FIG. 9, the power converter chip 230 is embedded in the core layer 900 of the processor package substrate 210. The core layer 900 can comprise a multilayer material and can comprise conductive "thru-holes" that are fabricated into the layer(s) of the core 900 and allow for the conduction of electrical current and signals therethrough. In some embodiments, the core layer 900 comprises a glass epoxy multilayer material, such as MCL-HS100, MCL-GS100, MCL-E-705G, or MCL-GEA-705G, available from Hitachi Chemical Co., Ltd. of Tokyo, Japan.

The core layer 900 can have a height, as measured with respect to axis 910, of about 1 mm or less, such as about 0.9 mm or less, or about 0.8 mm or less. To fit within the core layer 900, the power converter chip 230 can have about the same height (e.g., about 1 mm or less) as the core layer 900 or its height can be slightly less (e.g., about 1% to about 5% less) than the height of the core layer 900. The height of the power converter chip is also measured with respect to axis 910, which is orthogonal to the planes defined by the first and second sides 212, 214 of the processor package substrate 210.

Electrical terminals 930 can be disposed on opposing first and second sides 232, 234 of the power converter chip 230. The electrical terminals 930 can be electrically coupled to or can be disposed on through-silicon VIAs 940. The through-silicon VIAs 940 include an electrical conductor (e.g., copper and/or aluminum) that conducts electrical current between (and through) the electrical terminals 930 on the first and second sides 232, 234 of the power converter chip 230.

As illustrated, the processor module 22 and the power converter chip 230 are centered and aligned with respect to each other. For example, the processor 200 and the power converter chip 230 are centered and aligned with respect to each other such that the center points 201, 931 of the processor 200 and the power converter chip 230, respectively, are aligned. Alignment of the processor 200 and the power converter chip 230 is desirable to reduce the total distance between the processor 200 and the power converter chip 230, and consequently, the broadband electrical impedance of the interconnect that transfers power to the processor 200 from the power converter chip 230.

Figure 10:
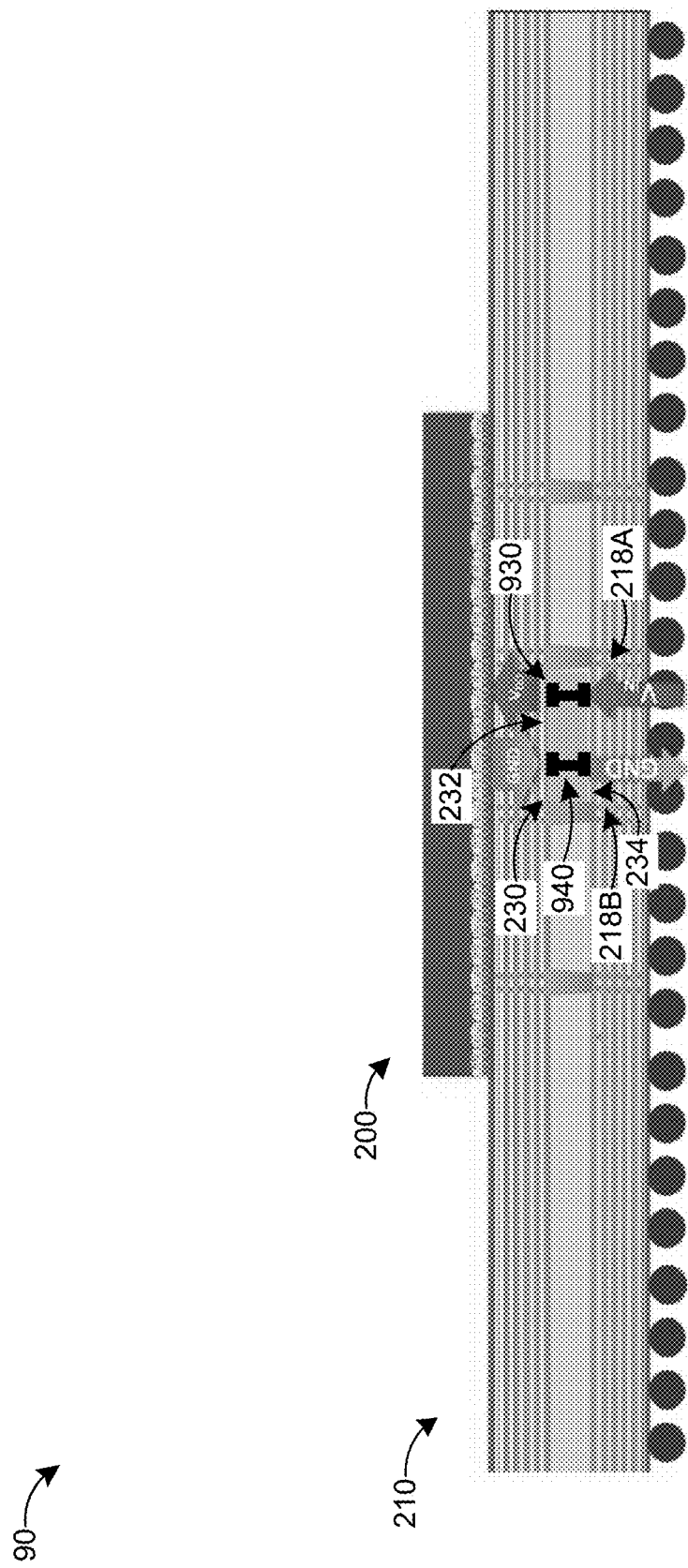
FIG. 10 includes representations of the electrical relationships among certain components in the cross section illustrated in FIG. 9.

The power converter chip 230 is disposed between neighboring conductive columns 218, which are in electrical communication with the processor 200. As illustrated in FIG. 10, a first conductive column 218A in the processor package substrate 210 conducts an input power (e.g., an input current at $V_{IN}$) from one or more processor package electrical terminals 215 to electrical terminals 930 on the second side 234 of the power converter chip 230. In addition, the first conductive column 218A conducts a supply current and supply voltage $V_{DD}$ from electrical terminals 930 on the first side 232 of the power converter chip 230 to the processor 200. A second conductive column 218B is grounded and conducts a ground current away from the processor 200 and the power converter chip 230. For example, the second conductive column 218B conducts ground current from the processor 200 to electrical terminals 930 on the first side 232 of the power converter chip 230. In addition, the second conductive column 218B conducts ground current from electrical terminals 930 on the second side 234 of the power converter chip 230 to one or more processor package electrical terminals 215. The power (e.g., voltage and current) passes through at least a portion of the through-silicon VIAs 940 in the power converter chip 230 in each direction (e.g., towards or away from the processor 200) where the input voltage $V_{IN}$ is converted to the supply voltage $V_{DD}$. In addition, the electrical path of the current can pass through a conductive layer 216 between the electrical terminals 930 on the power converter chip 230 (e.g., on the first and/or the second sides 232, 234 of the power converter chip 230) and the first and/or second conductive columns 218A, 218B.

Figure 11:
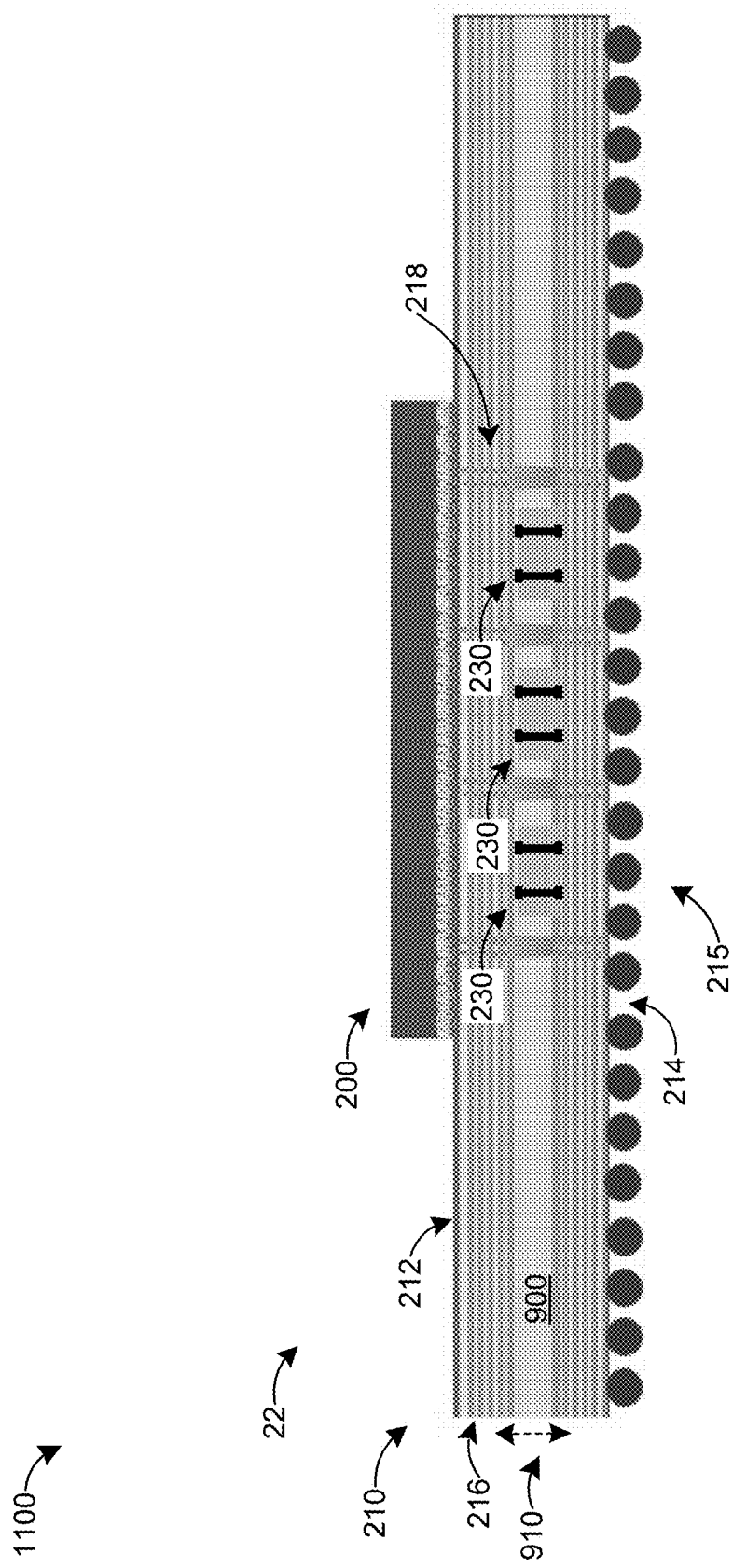
FIG. 11 is a cross-section of an assembly according to one or more embodiments.

FIG. 11 is a cross-section of an assembly 1100 according to one or more embodiments. The assembly is the same as assembly 90 except that assembly 1100 includes a plurality of power converter chips 230.

Figure 12:
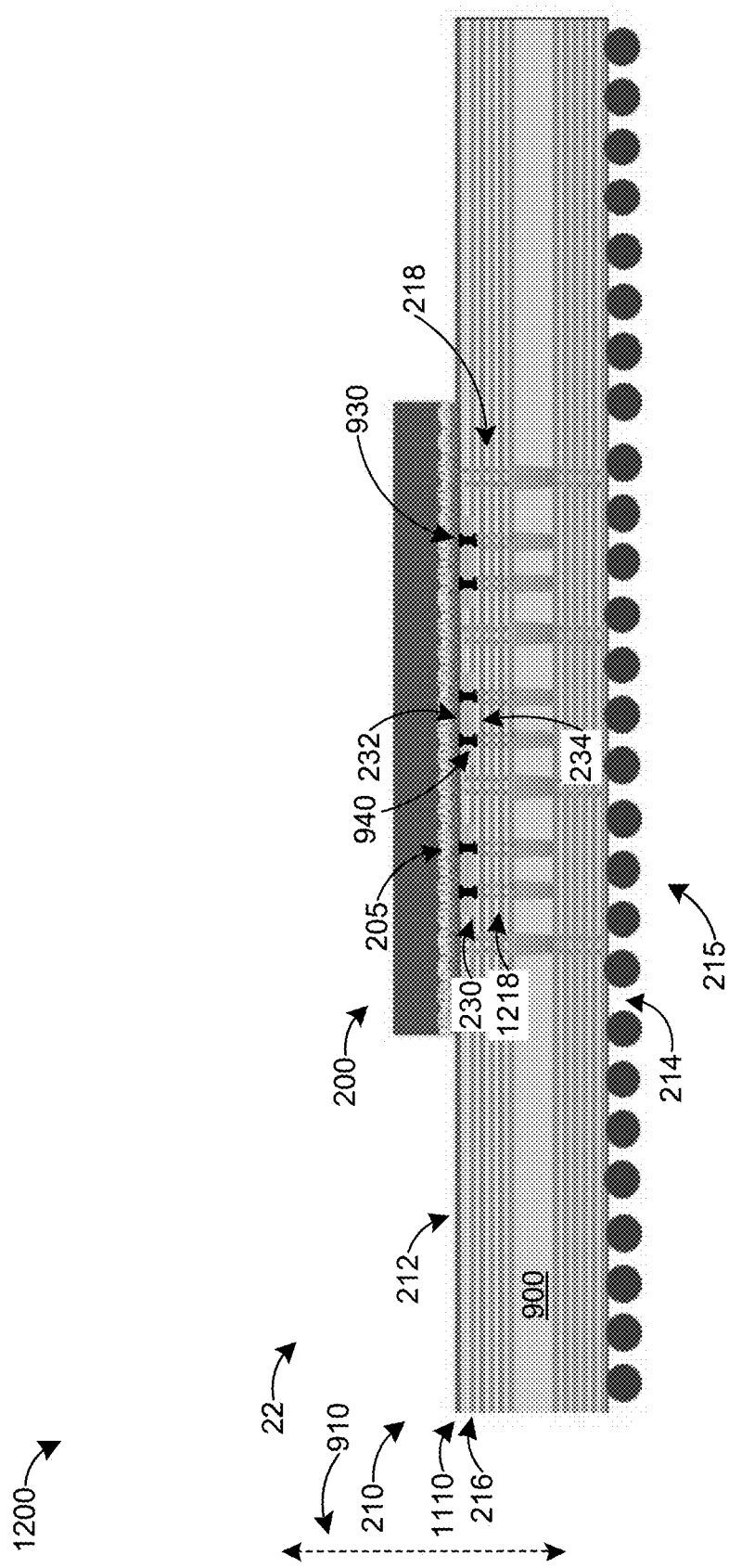
FIG. 12 is a cross-section of an assembly according to one or more embodiments.

FIG. 12 is a cross-section of an assembly 1200 according to one or more embodiments. The assembly is the same as assembly 1200 except that the power converter chips 230 are disposed proximal to the first side 212 of the processor package substrate 210. The power converter chips 230 can be disposed so the electrical terminals 930 on the first side 232 of the power converter chip 230 are in direct physical and electrical contact with corresponding electrical terminals 205 in the processor 200. For example, the power converter chips 230 can be disposed so they are embedded, at least in part, in the first conductive layer 216 on the first side 212 of the processor package substrate 210 (i.e., the conductive layer 216 closest to the first side 212 of the processor package substrate 210) In some embodiments, the power converter chips 230 are disposed below the outer layer 1110 of the processor package substrate 210.

The outer layer 1110 is on the "top" of the processor package substrate illustrated in FIG. 12 where an exposed surface of the outer layer 1110 forms the first side 212 of the processor package substrate 210. The outer layer 1110 can comprise about 5 μm to about 50 μm of copper that can be coated by a combination of a non-conductive polymer "soldermask" material and a coercion-resistant conductive layer, such as gold, that covers the copper on "pads" where the soldermask material is not present. The power converter chips 230 can be embedded below the outer layer 1110, or one-or-more similar layers (e.g., one or more layers below the outer layer 1110). The power converter chips 230 can be electrically coupled to the processor 200 through conductive VIAs or through conductive VIAs in combination with the conductive layers 216 in the processor package substrate 210.

The power converter chips 230 can have a height in the range of about 50 μm to about 800 μm, including about 100 μm, about 200 μm, about 300 μm, about 400 μm, about 500 μm, about 600 μm, and about 700 μm. The height is measured with respect to axis 910, which is orthogonal to the planes defined by the first and second sides 212, 214 of the processor package substrate 210. In some embodiments, having a height of about 0.15 mm (150 μm) or less (e.g., between about 50 μm and about 150 μm) can allow the power converter chips 230 to be embedded adjacent to or below the outer layer 1110 of the processor package substrate 210, without blocking an excessive number of inner layers in the processor package substrate 210. Each conductive layer 216 in the processor package substrate 210 is typically about 5 μm to about 50 μm thick (e.g., with respect to an axis 912 that is orthogonal to axis 910), with adjacent non-conductive polymer layers and VIAs being typically about 5 μm to about 25 μm thick, with respect to axis 912, such that a 150 μm thick power converter chip could block 1-10 conductive layers 216 in the processor package substrate 210.

Additional conductive columns 1218 (e.g., VIAs) can extend between the electrical terminals 930 on the second side 234 of the power converter chip 230 and at least one conductive layer 216 between the second side 234 of the power converter chip 230 and the core layer 900 of the processor package substrate 210 to provide a conductive path therebetween. The conductive columns 1218 can conduction additional signals and/or power from the conductive layer(s) 216 between the second side 234 of the power converter chip 230 and the core layer 900.

Figure 13:
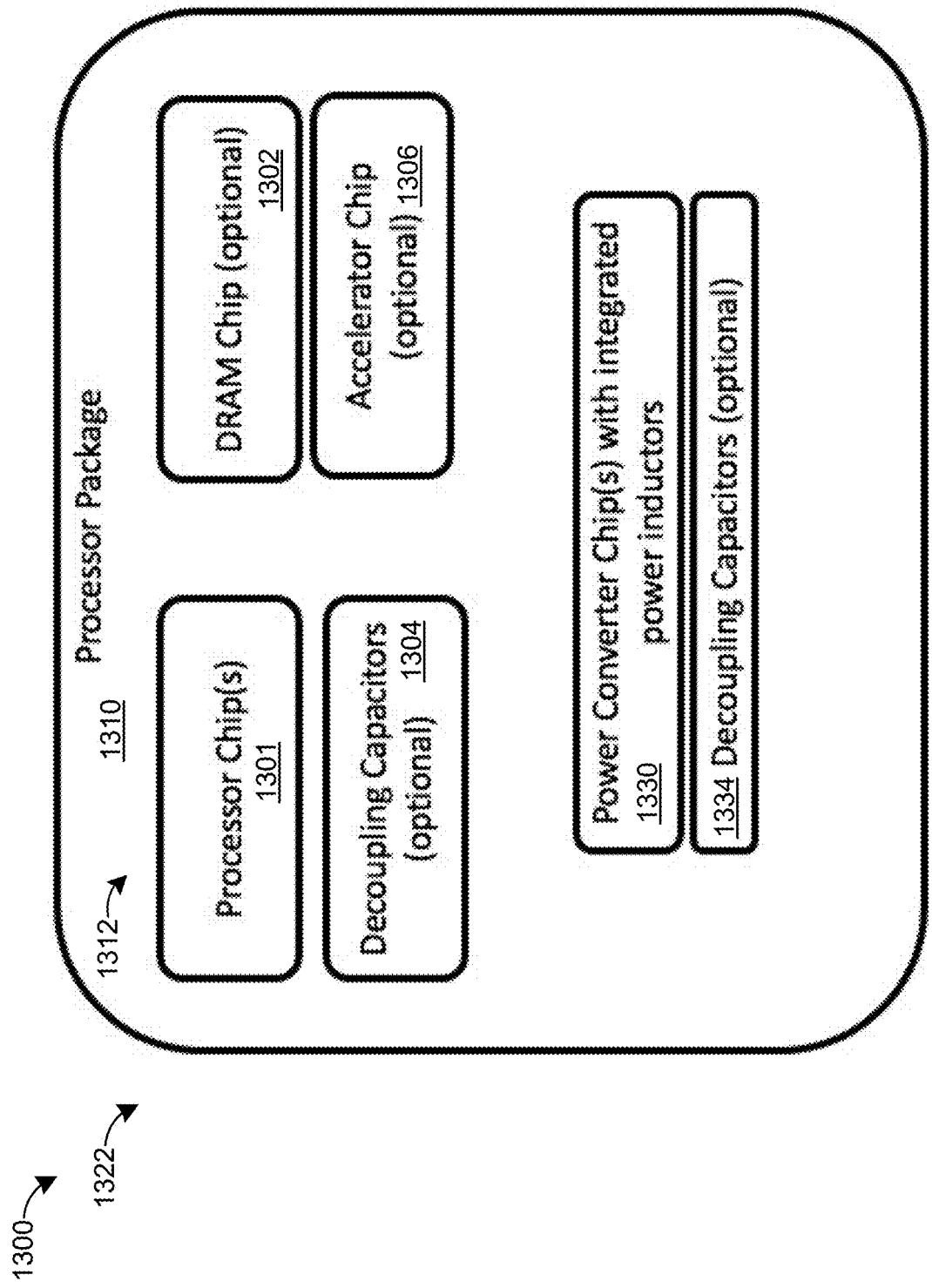
FIG. 13 is a block diagram of an assembly according to one or more embodiments.

FIG. 13 is a block diagram of an assembly 1300 according to one or more embodiments. The assembly 1300 includes a processor module 1322 and one or more power converter chips 1330. The processor module 1322 includes one or more processor chips 1301, optional memory chips 1302, optional decoupling capacitors 1304, an optional accelerometer chip 1306, and a processor package substrate 1310. The processor chip(s) 1301, the optional memory chip(s) 1302, the optional decoupling capacitors 1304, and the optional accelerometer chip 1306 are mounted on a first side 1312 of the processor package substrate 1310, such as by wire bonding, flip-chip attachment, or other method as known in the art.

In some embodiments, the processor chip(s) 1301 and the optional memory chip(s) 1302 are the same as or different than the processor chip(s) 400 and the optional memory chip(s) 402, respectively. In some embodiments, the processor chip(s) 1301 and optionally the memory chip(s) 1302 are the same as or different than the processor/SoC 200. In some embodiments, the processor module 1322 is the same as or different than processor module 22 and/or processor module 42.

The power converter chip(s) 1330 and the optional decoupling capacitors 1334 are mounted or embedded in one or more layers of the processor package substrate 1310. The power converter chip(s) 1330 include a thin-film power inductor, such as a magnetic core inductor or a magnetic clad inductor, that is integrated into a multilevel wiring network. For example, the power converter chip(s) 1330 can be the same as or different than the power converter chips and chiplets disclosed in U.S. Patent Application Publication No. 2018/0110123, titled "Integrated Switched Inductor Power Converter," published on Apr. 19, 2018. In some embodiments, the power converter chip(s) 1330 is/are the same as or different than power converter chip(s) 230, 430, and/or 60.

In some embodiments, assembly 1300 can be the same as or different than assemblies 90, 1100, and/or 1200.

The assembly 1300 includes processor package electrical terminals (e.g., processor package electrical terminals 215) (not illustrated in FIG. 13) on the second side of the processor package substrate 1310. The first side 1312 and second side are on opposing sides of the processor package substrate 1310. The processor package electrical terminals can include a BGA, an LGA, a PGA, and/or other custom socket connections.

Figure 14:
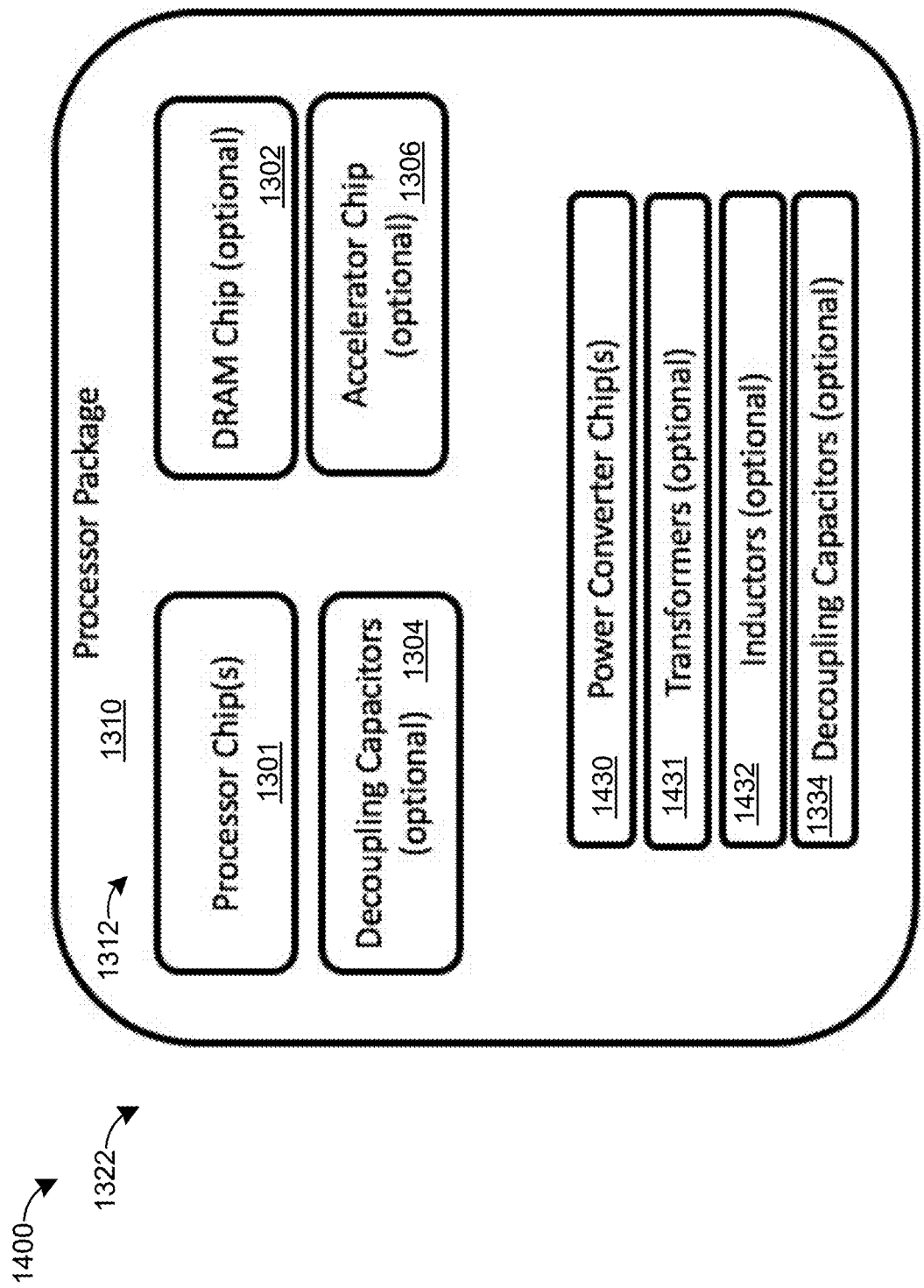
FIG. 14 is a block diagram of an assembly according to one or more embodiments.

FIG. 14 is a block diagram of an assembly 1400 according to one or more embodiments. The assembly 1400 includes processor module 1322 and one or more power converter chips 1430, one or more optional transformers 1431, one or more optional inductors 1432, and optional decoupling capacitors 1334. In this embodiment, the power converter chip(s) 1430 do not include an integrated thin-film power inductor, as described above with respect to power converter chip(s) 430. Instead, the power converter chip(s) 1430 are in electrical communication with the transformer(s) 1431 and/or inductor(s) 1432, which are not disposed on the power converter chip(s) 1430. The power converter chip(s) 1430, one or more optional transformers 1431, one or more optional inductors 1432, and optional decoupling capacitors 1334 are mounted or embedded in the processor package substrate 1310. The optional transformer(s) 1431 and optional inductor(s) 1432 are not disposed on the same substrate or chip as the power converter chip(s) 1430.

The power converter chip(s) 1430 can be the same as the power converter chip 230 and/or 530. In addition, the transformer(s) 1431 and/or inductor(s) 1432 can be the same as or different than the transformer(s) 531 and/or inductor(s) 532, respectively.

The assembly 1400 includes processor package electrical terminals (e.g., processor package electrical terminals 215) (not illustrated in FIG. 14) on the second side of the processor package substrate 1310. The first and second sides are on opposing sides of the processor package substrate 1310. The processor package electrical terminals can include a BGA, an LGA, a PGA, and/or other custom socket connections.

Figure 15:
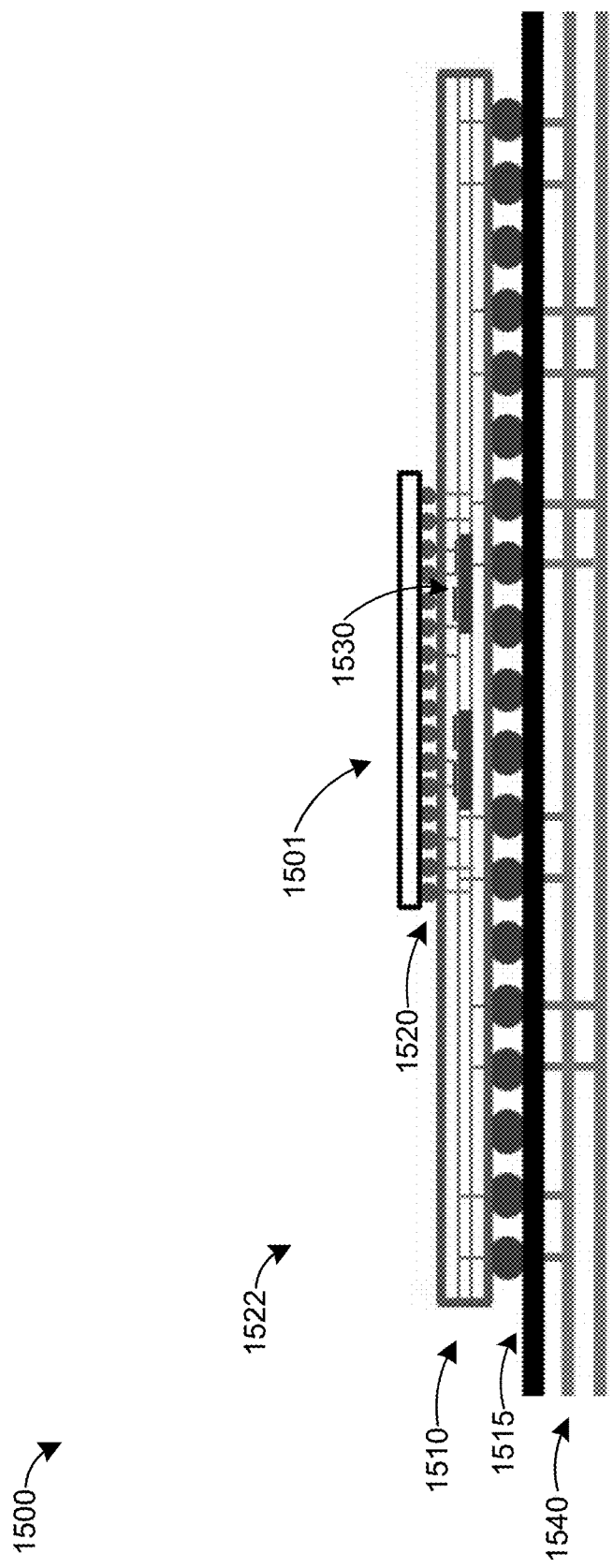
FIG. 15 is a cross-section of an assembly according to one or more embodiments.

FIG. 15 is a cross-section of an assembly 1500 according to one or more embodiments. The assembly 1500 includes a processor module 1522, power converter chips 1530, and a circuit board 1540. The processor module 1522 includes a processor 1501 and a processor package substrate 1510. The processor 1501 is electrically mounted on the processor package substrate 1510 using processor electrical terminals 1520 which can include a BGA (e.g., as illustrated in FIG. 15), an LGA, a PGA, or other custom socket connections. The power converter chips 1530 are embedded in one or more layers (e.g., in the core layer) of the processor package substrate 1510, for example as described above. The processor package substrate 1510 is electrically mounted on the circuit board 1540 using processor package electrical terminals 1515 which can include a BGA (e.g., as illustrated in FIG. 15), an LGA, a PGA, or other custom socket connections.

The processor module 1522 can be the same as or different than processor module 1322, processor module 22 and/or processor module 42. The processor 1501 can be the same as or different than processor chip(s) 1301 (which can optionally include memory chip(s) 1302), processor chip(s) 400 (which can optionally include memory chip(s) 402), and/or processor/SoC 200. The power converter chips 1530 can be the same as or different than power converter chip(s) 1330, power converter chip(s) 1430, power converter chip 230, power converter chip(s) 430, power converter chip(s) 530, and/or power converter chip 60. The processor package electrical terminals 1515 can be the same as or different than processor package electrical terminals 215.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. An assembly comprising:
   a processor module comprising:
   a processor package substrate having opposing first and second sides;
   a processor chip mounted on the first side of the processor package substrate;
   an array of electrical terminations disposed on the second side of the processor package substrate; and
   conductive interconnects extending across the first and second sides of the processor package substrate; and
   a power converter chip embedded in the processor package substrate, the power converter chip configured to down convert an input voltage to a supply voltage, the supply voltage lower than the input voltage,
   wherein the conductive interconnects are electrically coupled to the power converter chip and the processor chip to provide the supply voltage to the processor chip.

2. The assembly of claim 1, wherein the processor package substrate comprises an organic polymer.

3. The assembly of claim 1, wherein a height of the power converter chip is about 50 μm to about 150 μm, the height measured with respect to an axis that is orthogonal to a plane defined by the first side of the processor package substrate.

4. The assembly of claim 3, wherein the power converter chip is configured to fit within a core layer of the processor package substrate.

5. The assembly of claim 1, further comprising electrical terminations disposed on opposing first and second sides of the power converter chip.

6. The assembly of claim 1, wherein the power converter chip comprises silicon, gallium arsenide, or gallium nitride.

7. The assembly of claim 6, wherein the power converter chip comprises:
   a multilevel wiring network; and
   an inductor integrated on top of the multilevel wiring network.

8. The assembly of claim 7, wherein the inductor comprises a conductive winding, the conductive winding comprising:
   a first wire formed in a first integration plane disposed above the multilevel wiring network;

a second wire formed in a second integration plane disposed above the first integration plane; and a conductive VIA formed between the first and second wires, the conductive VIA electrically connecting the first wire to the second wire.

9. The assembly of claim 7, wherein the inductor comprises a planar magnetic core having alternating ferromagnetic and insulating layers.

10. The assembly of claim 7, wherein the power converter chip comprises through-silicon VIAs that conduct electrical current through electrical terminations disposed on opposing first and second sides of the power converter chip.

11. The assembly of claim 7, further comprising a plurality of inductors integrated on top of the multilevel wiring network, the inductors configured to operate in a phase-interleaved manner to regulate an output supply voltage of the power converter chip.

12. The assembly of claim 1, further comprising a plurality of the power converter chips, each power converter chip embedded in the processor package substrate.

13. The assembly of claim 12, wherein a first power converter chip outputs a first supply current at a first supply voltage and a second power converter chip outputs a second supply current at a second supply voltage.

14. The assembly of claim 13, wherein the first supply voltage is different than the second supply voltage.

15. The assembly of claim 1, wherein the power converter chip includes one or more capacitors, one or more inductors, one or more transformers, or a combination of any of the foregoing.

16. The assembly of claim 1, wherein the processor module and the power converter chip are aligned and centered with respect to each other to reduce a distance for electrical current to travel therebetween.

17. The assembly of claim 1, wherein the power converter chip is embedded between a core layer and the first side of the processor package substrate.

18. The assembly of claim 17, wherein the power converter chip is disposed below an outer layer of the processor package substrate, wherein an exposed side of the outer layer forms the first side of the processor package substrate.

19. The assembly of claim 1, wherein the conductive interconnects include first and second conductive studs that extend across the first and second sides of the processor package substrate, the power converter chip disposed between the first and second conductive studs.

20. The assembly of claim 19, wherein:

the first conductive stud conducts an input power from first electrical terminations on the processor package substrate to first electrical terminals on a second side of the power converter chip, the first conductive stud conducts a supply current and a supply voltage from first electrical terminals on a first side of the power converter chip to the processor chip, the second conductive stud conducts a ground current from the processor chip to second electrical terminals on the first side of the power converter chip, and the second conductive stud conducts the ground current from second electrical terminals on the second side of the power converter chip to second electrical terminations on the processor package substrate.

* * * * *